US009453161B2

(12) United States Patent
Zhuravleva et al.

(10) Patent No.: US 9,453,161 B2
(45) Date of Patent: *Sep. 27, 2016

(54) CHLORIDE, BROMIDE AND IODIDE SCINTILLATORS WITH EUROPIUM DOPING

(71) Applicant: University of Tennessee Research Foundation, Knoxville, TN (US)

(72) Inventors: Mariya Zhuravleva, Knoxville, TN (US); Kan Yang, Solon, OH (US)

(73) Assignee: University of Tennessee Research Foundation, Knoxville, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/314,393

(22) Filed: Jun. 25, 2014

(65) Prior Publication Data
US 2014/0363674 A1    Dec. 11, 2014

Related U.S. Application Data

(63) Continuation-in-part of application No. 13/351,748, filed on Jan. 17, 2012, now Pat. No. 8,815,119, which is a continuation-in-part of application No. 13/098,654, filed on May 2, 2011, now Pat. No. 8,692,203.

(Continued)

(51) Int. Cl.
*C09K 11/61* (2006.01)
*C09K 11/77* (2006.01)
(Continued)

(52) U.S. Cl.
CPC ....... *C09K 11/7733* (2013.01); *C04B 35/5152* (2013.01); *C04B 35/6455* (2013.01);
(Continued)

(58) Field of Classification Search
CPC .................................................. C09K 11/7733
See application file for complete search history.

(56) References Cited

U.S. PATENT DOCUMENTS 4,740,699 A    4/1988    Miura et al.
6,369,391 B1   4/2002    Hefetz et al.
(Continued)

FOREIGN PATENT DOCUMENTS

EP    2060614 A3    5/2009
EP    2387040 A3    11/2011

OTHER PUBLICATIONS

Cherepy, et al, "Strontium and barium iodide high light yield scintillators", Applied Physics Letters, vol. 92, (2008), (3 pages).
(Continued)

*Primary Examiner* — Carol M Koslow
(74) *Attorney, Agent, or Firm* — Cameron LLP

(57) ABSTRACT

A halide scintillator material is disclosed where the halide may comprise chloride, bromide or iodide. The material is single-crystalline and has a composition of the general formula $ABX_3$ where A is an alkali, B is an alkali earth and X is a halide which general composition was investigated. In particular, crystals of the formula $ACa_{1-y}Eu_yI_3$ where A=K, Rb and Cs were formed as well as crystals of the formula $CsA_{1-y}Eu_yX_3$ (where A=Ca, Sr, Ba, or a combination thereof and X=Cl, Br or I or a combination thereof) with divalent Europium doping where $0 \leq y \leq 1$, and more particularly Eu doping has been studied at one to ten mol %. The disclosed scintillator materials are suitable for making scintillation detectors used in applications such as medical imaging and homeland security.

2 Claims, 19 Drawing Sheets

Related U.S. Application Data

(60) Provisional application No. 61/443,076, filed on Feb. 15, 2011, provisional application No. 61/491,074, filed on May 27, 2011, provisional application No. 61/332,945, filed on May 10, 2010.

(51) Int. Cl.

| | | |
|---|---|---|
| *C30B 29/12* | (2006.01) | |
| *C04B 35/515* | (2006.01) | |
| *C04B 35/645* | (2006.01) | |
| *C30B 11/00* | (2006.01) | |
| *G21K 4/00* | (2006.01) | |
| *C30B 15/00* | (2006.01) | |

(52) U.S. Cl.
CPC ............ *C09K11/7791* (2013.01); *C30B 11/00* (2013.01); *C30B 15/00* (2013.01); *C30B 29/12* (2013.01); *G21K 4/00* (2013.01); *C04B 2235/3208* (2013.01); *C04B 2235/3213* (2013.01); *C04B 2235/3215* (2013.01); *C04B 2235/3224* (2013.01); *C04B 2235/9653* (2013.01); *Y10T 428/2982* (2015.01)

(56) References Cited

U.S. PATENT DOCUMENTS

| | | | | |
|---|---|---|---|---|
| 8,692,203 | B1* | 4/2014 | Yang ................ | C09K 11/7733 250/361 R |
| 8,815,119 | B2* | 8/2014 | Zhuravleva ........ | C09K 11/7733 117/940 |
| 2005/0061992 | A1 | 3/2005 | Kasai et al. | |
| 2005/0072937 | A1 | 4/2005 | Kondo et al. | |
| 2006/0163538 | A1 | 7/2006 | Schierning et al. | |
| 2011/0024635 | A1 | 2/2011 | Shah et al. | |
| 2011/0165422 | A1 | 7/2011 | Gundiah et al. | |
| 2011/0272585 | A1 | 11/2011 | Yang et al. | |
| 2011/0272586 | A1 | 11/2011 | Yang et al. | |
| 2012/0001282 | A1 | 1/2012 | Goto et al. | |
| 2012/0193539 | A1* | 8/2012 | Bizarri ............... | C09K 11/7733 250/361 R |

OTHER PUBLICATIONS

Kramer, et al, "Development and Characterization of Highly Efficient New Cerium Doped Rare Earth Halide Scintillator Materials", J. Mater. Chem., 2006, 16, pp. 2773-2780.

Ma, et al, "Thermodynamic calculation of the GdCl3-ACl(A=Na,K,Rb,Cs) phase diagrams based on experimental data", Calphad, vol. 30, Issue 1, Mar. 2006, pp. 88-94.

Schilling, et al., "Ternary Bromide and Iodides of Divalent Lanthanides and Thier Alkaline-Earth Analoga of the Type AMX3 and Am2X5," Z. anorg. allg. Chem. 622 (1996), pp. 759-765.

Grimm et al., "Upconversion Between 4f-5d Excited States in Tm2+-Doped CsCaCl3, CsCaBr3, and CsCaI3," Chem. Eur. J. (2007), 13, Wiley-VCH Verlag GmbH & Co., Weinheim, DE, pp. 1152-1157.

Zhuravleva, Mariya et al., "Crystal Growth and Scintillation Properties of Cs3CeCl6 and CsCe2Cl7," J. Crystal Growth (2010), Elsevier, 4 pages.

Higgins, et al, "Bridgman growth of LaBr3:Ce and LaCl3:Ce crystals for high-resolution gamma-ray spectrometers", J. Crystal Growth 287 (2006) pp. 239-242.

Seifert, H.J., "Ternary chlorides of the trivalent early lanthanides: Phase diagrams, crystal structures and thermodynamic properties", J. Thermal Analysis and Calorimetry 67 (2002), pp. 789-826.

Kapala, et al, "Modelling of the thermodynamic properties of the ABr-CeBr3 (a=Li-Cs ) systems", Calphad, vol. 34, Issue 1, Mar. 2010, pp. 15-19.

Rycerz, et al, "Phase diagram and electrical conductivity of the CeBr3—CsBr binary system", J. Therm. Anal. Calorim. 97 (2009), pp. 1015-1021.

Xinhua et al, "Fluorescence Spectra of ARE2I5 and AREI3 in the Solid State (A [identical to] K, Rb, Cs, Ti; RE [identical to] Sm, Eu)", Journal of Alloys and Compounds, vol. 180, Issues 1-2, Mar. 25, 1992, pp. 235-238.

Baopeng, et al, "Synthesis and structure of AEuI3 (A[triple bond; length as m-dash]Rb, Cs) and AEu2I5 (a[triple bond; length as m-dash]K, Rb, Cs)", Journal of Alloys and Compounds, vol. 181, Issues 1-2, Proceedings of the 19th Rare Earth Research Conference, Apr. 3, 1992, pp. 511-514.

Bourret-Courchesne, et al., "Eu2+-doped Ba2CsI5, a New High-performance Scintillator," Nuclear Instruments and Methods in Physics Research A 612 (2009), Elsevier, pp. 138-142.

Gundiah, et al., "Scintillation Properties of Eu2+-activated Barium Fluoroiodide," 2009 IEEE Nuclear Science Symposium Conference Record, pp. 1575-1578.

Bourret-Courchesne, et al., "BaBrI:Eu2+, a New Bright Scintillator," Nuclear Instruments and Methods in Physical Research A 613 (2010), Elsevier, pp. 95-97.

Dorenbos, "Thermal Quenching of Eu2+ 5d-4f Luminescence in Organic Compounds," J. Phys.: Condes. Matter 17 (2005), pp. 8103-8111.

Glodo et al., "Spectroscopy of Selected Alkaline Earth Halides," IEEE (2010), pp. 271-274.

Selling et al., "Europium-doped Barium Halide Scintillators for X-ray and Gamma-ray Detections," Journal of Applied Physics 101, 034901 (2007), pp. 1-5.

Bao, Xinhua et al., "Phase diagram of the CsBr-CaBr2 System", Rare Metals, vol. 25, No. 3, Jun. 2006, pp. 293-296.

Vishnevckii. I. P. et al., "Luminescence of europium (2+)-activated cesium calcium chloride single crystals," Izvestiya Vysshikh Uchebnykh Zaedenii, Fizika (1982), vol. 25, Is 1, pp. 91-92 (Russian article and Abstract in English).

Borade, R. B. et al., Novel Lanthanide Doped Cesium-Alkaline Earth Metal Halide Scintillators, Lawrence Berkely National Laboratory, 28 pages, U.S. Appl. No. 61/392,438, filed Oct. 12, 2010.

Rodnyi, P. A., Efficiency and Yield Spectra of Inorganic Scintillators, Radiation Measurements vol. 29, No. 3-4, pp. 235-242, 1998.

Gahane, D. H. et al., Luminescence of some Eu2+ activated bromides, Journal of Alloys and Compounds 484, pp. 660-664 (2009).

\* cited by examiner

CsSrCl$_3$: Eu 10%

CsSrBr$_3$: Eu 10%

CsCaCl$_3$: Eu 10%

CHLORIDE, BROMIDE AND IODIDE SCINTILLATORS WITH EUROPIUM DOPING

CROSS-REFERENCE TO RELATED APPLICATIONS

The present application is a continuation-in-part of U.S. patent application Ser. No. 13/351,748 filed Jan. 17, 2012, now U.S. Pat. No. 8,815,119 issued Aug. 26, 2014, which application claims the benefit of U.S. Provisional Application Ser. No. 61/443,076 filed Feb. 15, 2011 and of U.S. Provisional Application Ser. No. 61/491,074 filed May 27, 2011, and U.S. patent application Ser. No. 13/351,748 is a continuation-in-part of U.S. patent application Ser. No. 13/098,654, filed May 2, 2011 (now U.S. Pat. No. 8,692,203 issued Apr. 8, 2014) which claims the benefit of U.S. provisional patent application Ser. No. 61/332,945, filed May 10, 2010, all of Zhuravleva et al., all priority applications being incorporated by reference herein in their entirety.

STATEMENT OF GOVERNMENT SUPPORT

The invention was made with government support under Contract No. DHS-DNDO 2009-DN-077-AR103I-03 awarded by the Department of Homeland Security and under DOE-NA22: DE-NA0000473 awarded by the U.S. Department of Energy. The government has certain rights in the invention.

TECHNICAL FIELD

The present invention generally relates to new chloride, bromide and iodide scintillator crystals with divalent Europium doping, and, more particularly, to halide scintillators represented by one of the following formulae: $ACa_{1-y}Eu_yX_3$ (where A=K, Rb or Cs, or a combination thereof, and $0 \leq y \leq 1$) and $CsA_{1-y}Eu_yX_3$ (where A=Ca, Sr, Ba, or a combination thereof, and $0 \leq y \leq 1$) and X=Cl, Br or I or a combination thereof in either formulae.

BACKGROUND

A halide scintillator for radiation detection is described in U.S. Published Patent Application No. 2011/0272585 and a chloride scintillator for radiation detection is described in U.S. Published Application No. 2011/0272586 published Nov. 10, 2011, both published applications of Zhuravleva et al. of the University of Tennessee. The halide scintillator is single-crystalline crystalline and has a composition of the formula $A_3MBr_{6(1-x)}Cl_{6x}$ or $AM_2Br_{7(1-x)}Cl_{7x}$ wherein A consists of one of Li, Na, K, Rb, Cs or any combination thereof, and M consists of Ce, Sc, Y, La, Lu, Gd, Pr, Tb, Yb, Nd or any combination thereof and $0 \leq x \leq 1$. The chloride scintillator is also single crystalline and has a composition of the formula $AM_2Cl_7$ and A and M consist of the elements indicated above. A modified Bridgman technique was used to form the crystals. A Bridgman method is described in Robertson J. M., 1986, Crystal Growth of Ceramics: Bridgman-Stockbarger method in Bever: 1986 "Encyclopedia of Materials Science and Engineering," Pergamon, Oxford pp. 963-964" among other known tutorials incorporated by reference herein as to any material deemed essential to an understanding of the Bridgman method.

An iodide scintillator for radiation detection is described in EP 2387040 published Nov. 16, 2011 and claims priority to U.S. patent application Ser. No. 13/098,654 filed May 2, 2011 and to U.S. provisional patent application Ser. No. 61/332,945 filed May 10, 2010, also of Zhuravleva et al. of the University of Tennessee. The disclosed iodide scintillators have a composition of the formula $AM_{1-x}EuI_3$, $A_3M_{1-x}Eu_xI_5$ and $AM_{2(1-x)}Eu_{2x}I_5$, wherein A consists essentially of an alkali element (such as Li, Na, K, Rb, Cs) or any combination thereof, M consists essentially of Sr, Ca, Ba or any combination thereof, and $0 \leq x \leq 1$. These iodide scintillator crystals were made by first synthesizing a compound of the above composition and then forming a single crystal from the synthesized compound, for example, by the Vertical Gradient Freeze method. In particular, high-purity starting iodides (such as CsI, $SrI_2$, $EuI_2$ and rare-earth iodide(s)) are handled in a glove box with, for example, pure nitrogen atmosphere and then mixed and melted to synthesize a compound of the desired composition of the scintillator material. A single crystal of the scintillator material is then grown from the synthesized compound by the Bridgman method or Vertical Gradient Freeze (VGF) method, in which a sealed ampoule containing the synthesized compound is transported from a hot zone to a cold zone through a controlled temperature gradient at high speed to form the single-crystalline scintillator from molten synthesized compound. The ampoule may be sealed with a hydrogen torch after creating a vacuum on the order of $1 \times 10^{-6}$ millibars. The scintillator crystal may be cut and polished using sand papers and mineral oil and then optically coupled to a photon detector such as a photomultiplier tube (PMT), arranged to receive the photons generated by the scintillator and adapted to generate a signal indicative of the photon generation. Typically, plates about 1-3 mm in thickness may be cut from the bottles and small samples selected for the optical characterization. This scintillator crystal work has been continuing at the University of Tennessee, Scintillation Materials Research Center, Knoxville, Tenn.

Also, pursuant to U.S. Published Patent Application No. 2011/0165422, published Jul. 7, 2011, complimentary development of a lanthanide doped strontium barium mixed halide scintillator crystal, for example, $Sr_{0.2}Ba_{0.75}Eu_{0.05}BrI$ has been developed with 5% Eu doping, also using a Bridgman growth technique, at the University of California.

Pursuant to U.S. Published Patent Application No. 2011/0024635 published Feb. 3, 2011, of Shah et al., a lithium containing halide scintillator composition is disclosed. This CsLiLn composition appears to have been produced at Radiation Monitoring Devices, Inc. of Watertown, Mass.

The need for radiation detecting materials has been at the forefront of materials research in recent years due to applications in national security, medical imaging, X-ray detection, gamma-ray detection, oil well logging (geological applications) and high energy physics among other applications. Typically, a crystal of the types described above desirably exhibit high light yields, fast luminescence decay (for example, below 1000 ns), good stopping power, high density, good energy resolution, ease of growth, proportionality and stability under ambient conditions. $La_xBr_3:Ce_{1-x}$ (E. V. D. van Loef et al., Applied Physics Letters, 2007, 79, 1573) and $Sr_xI_2:Eu_{1-x}$ (N. Cherepy et al., Applied Physics Letters, 2007, 92, 083508) are present day benchmark materials that satisfy some of the desired criteria, but their application is limited due to the extreme hygroscopic nature. Other known benchmarks that are commercially available include bismuth germanate (BGO) and NaI:Tl available from a number of sources.

There remains a need in the an for further research and development of scintillator crystal materials for the applications described above.

SUMMARY OF THE DISCLOSURE

This summary is provided to introduce a selection of concepts. These concepts are further described below in the Detailed Description. This summary is not intended to identify key features or essential features of the claimed subject matter, nor is this summary intended as an aid in determining the scope of the claimed subject matter.

The present invention meets the above-identified needs by providing inorganic scintillator crystals such as halide scintillators with divalent Europium doping represented by one of the following formulae: $ACa_{1-y}Eu_yX_3$ (where A=K, Rb or Cs, or a combination thereof and X=Cl, Br or I or a combination thereof and $0 \leq y \leq 1$) and $CsA_{1-y}Eu_yX_3$ (where A=Ca, Sr, Ba, or a combination thereof and X=Cl, Br or I or a combination thereof and $0 \leq y \leq 1$). Generally, an embodiment comprises $ABX_3$ where A is an alkali, B is an alkali earth and X is a halide.

In one embodiment, an inorganic single crystal scintillator comprises the formula: $ACa_{1-y}Eu_yX_3$ (where A=K, Rb or Cs, or a combination thereof and X=Cl, Br or I or a combination thereof and $0 \leq y \leq 1$). In particular, crystals were formed for $KCaI_3$:Eu from studying a known $KI$—$CaI_2$ phase diagram system whereby a Potassium Iodide (KI) and Calcium Iodide ($CaI_2$) graph plotted from a mole concentration of 0% KI to 100% $CaI_2$ versus temperature between, for example, 200 and 800° C.; (phase diagrams are available from the National Institute of Standards and Technology (NIST) phase diagrams database). Also, crystals were formed for $RbCaI_3$, for $CsCaI_3$ and for $CsCaCl_3$ following known phase diagrams and by utilizing as pure and anhydrous raw materials as possible. Anhydrous RbI not being generally available, techniques were employed to purify the RbI raw material using known techniques. These crystals were grown using one of a vertical gradient freeze or a modified Bridgman method. A Czochralski technique or combination Bridgman/Czochralski method may be used as an alternative process for growing scintillator crystals.

In another embodiment, an inorganic single crystal scintillator comprises the formula: $CsA_{1-y}Eu_yX_3$ (where A=Ca, Sr, Ba or a combination thereof, and $0 \leq y \leq 1$) and X=Cl, Br or I or a combination thereof. Similar growth techniques were employed and their characteristics studied as scintillators.

Further features and advantages of the present invention, as well as the structure and operation of various aspects of the present invention, are described in detail below with reference to the accompanying drawings.

BRIEF DESCRIPTION OF THE DRAWINGS

The features and advantages of the present invention will become more apparent from the detailed description set forth below when taken in conjunction with the drawings in which like reference numbers indicate identical or functionally similar elements.

FIGS. 1, 2 and 9 comprise PRIOR ART phase diagrams obtained via the National Institute of Standards and Technology (NIST) phase diagram database and are reproduced here for purposes of enablement of one of ordinary skill in the art.

FIG. 1 is a PRIOR ART phase diagram of a $KI$—$CaI_2$ system whereby KI is shown at left and $CaI_2$ is shown at right between 0 and 100% mol concentration while temperature is depicted along the left vertical axis between 200° C. and 800° C. The diagram shows formation of a congruently melting compound $KCaI_3$ and points to the fact that crystals of $KCaI_3$ can be grown from the melt.

FIG. 2 is a PRIOR ART phase diagram of $KCaI_3$ as well as similar systems for RbI to $CaI_2$ and CsI to $CaI_2$ also between 200° C. and 800° C. All three compounds, $KCaI_3$, $CsCaI_3$ and $RbCaI_3$ are congruently melting compounds and, therefore, their crystals can be grown from the melt.

FIG. 13A represents CsCaCl$_3$:Eu 10%; FIG. 13B represents CsSrCl$_3$:Eu 10% and FIG. 13C represents CsSrBr$_3$:Eu 10%. Scintillation time profiles were recorded using a $^{137}$Cs gamma-ray source. Scintillation decay constants obtained from fitting the curves with exponential functions are shown in legends.

FIG. 14A represents CsCaCl$_3$:Eu 10%; FIG. 14B represents CsSrCl$_3$:Eu 10% and FIG. 14C represents CsSrBr$_3$:Eu 10% normalized to a benchmark bismuth germanate (BGO) standard sample with its photopeak at channel 100.

FIG. 15A represents CsSrBr$_3$:Eu 10% and FIG. 15B is a similar graph for CsCaCl$_3$:Eu 10%.

DETAILED DESCRIPTION

The present invention is generally directed to new inorganic scintillator crystals from the concept ABX$_3$ where A is an alkali, B is an alkali earth and X is a halide comprising one of chlorine, bromine and iodine. Also, levels of divalent Europium doping were investigated between 1% and 10% with exemplary scintillator crystals grown and their characteristics recorded. It is also directed to combination inorganic crystal scintillators where Cesium, Strontium, Calcium and Barium are used in combination, for example, to form scintillator crystals of the formula CsSrX$_3$:Eu 1 to 10% or CsCaX$_3$:Eu 1 to 10% or CsSrBaX$_3$:Eu 1 to 10% with divalent Europium doping for substitution with one of the other divalent elements (Sr, Ca and SrBa combination). First, the formation of ACaI$_3$ crystals with divalent Europium doping will be discussed as one example followed by a discussion of the combination crystals.

Example 1

ACa$_{1-y}$Eu$_y$I$_3$ where A=K, Rb and Cs

Figure 1:
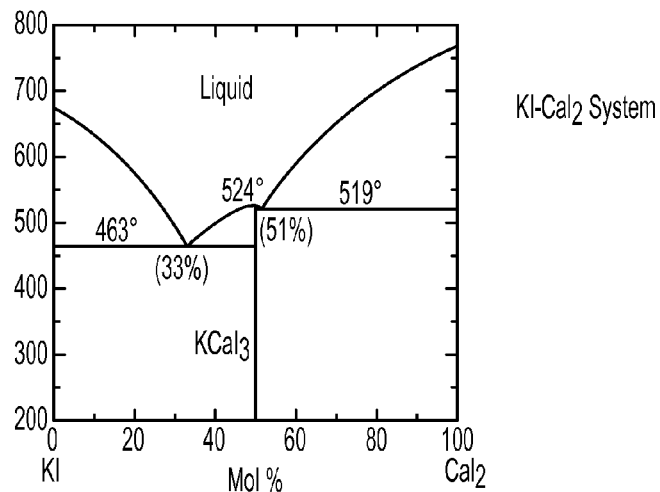

Referring to FIG. 1, there is shown a PRIOR ART exemplary system potassium iodide and calcium iodide showing a mol concentration versus temperature plot. Halide salts generally rapidly absorb moisture and preferably are maintained dry so as not to pre-assume a crystalline form with water. As will be explained herein, the purification process and handling of these halide salts is best performed under protective atmosphere to obtain pure, anhydrous salts, for example, using a zone refining technique in furnaces, melt-filtering or other known techniques where the material may be sealed in a quartz ampoule either under vacuum or nitrogen or argon gas.

Figure 2:
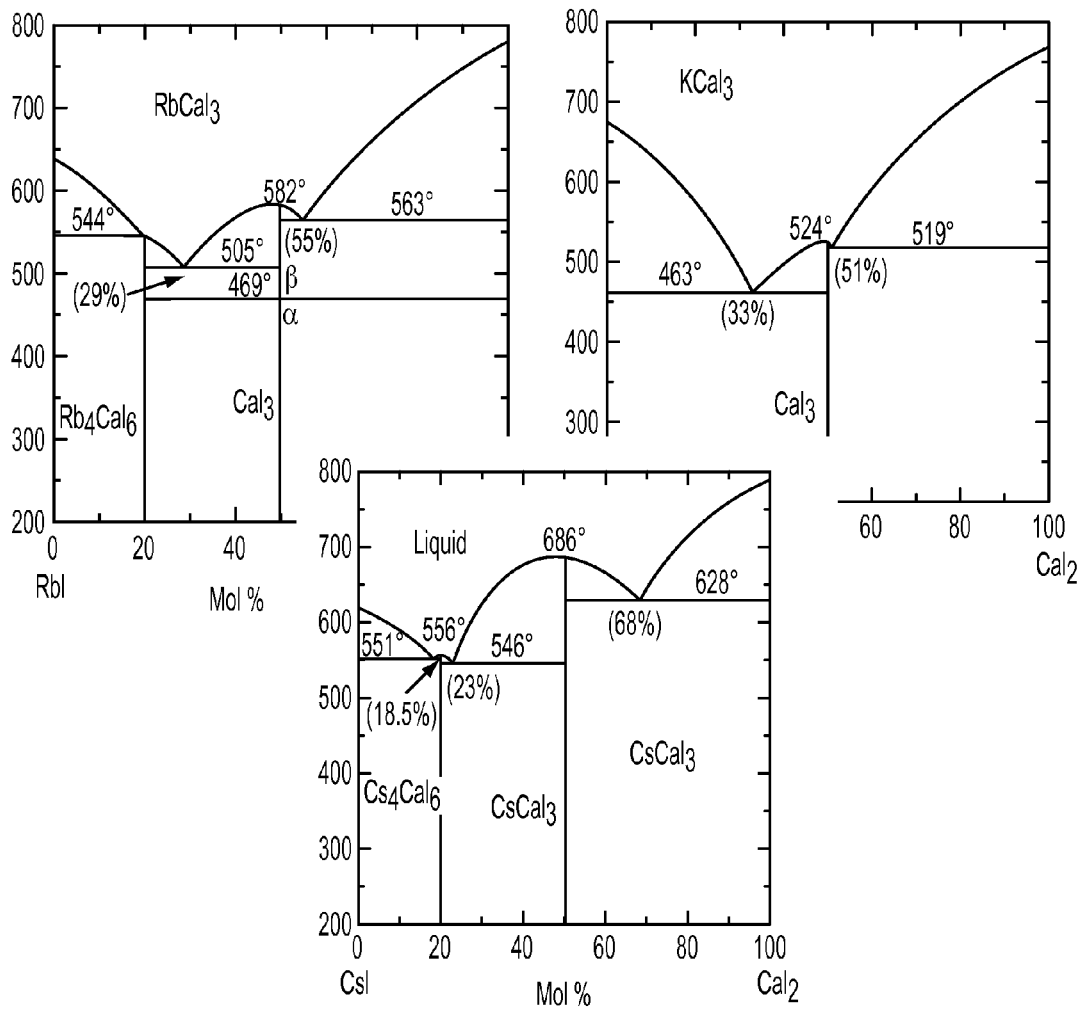

FIG. 2 shows similar plots for rubidium and cesium, respectively, and calcium chloride. RbI is presently not available in pure, anhydrous form and must be purified and rendered as anhydrous as possible using known techniques.

First referring to FIG. 1, KCaI$_3$ is a congruently melting compound with a melting point at 524° C.

The PRIOR ART table 1 below provides the details for each crystal formed for each of potassium, rubidium and cesium and Z$_{eff}$ calculated using a known formula:

TABLE 1

|  | KCaI$_3$ | RbCaI$_3$ | CsCaI$_3$ |
| --- | --- | --- | --- |
| T$_m$, ° C. | 524 | 582 | 686 |
| Crystal Structure | Ortho-rhombic | Ortho-rhombic | Ortho-rhombic |
| Phase transition, ° C. | No | 470 | No |
| Density, g/cm$^3$ | 3.81 | NA | 4.06 |
| Z$_{eff}$ | 50.6 | 50.0 | 52.6 |

From the table 1 summary above, all three crystals exhibit an orthorhombic crystal structure. Accurate black and white line drawings of the respective crystals with Eu 3% are depicted in FIG. 8. The melting temperature varies from 524° C. for potassium to 686° C. for Cesium. There is no phase transition exhibited for either potassium or cesium. A phase transition at 469° C. or approximately 470° C. was noted for rubidium. The Z$_{eff}$ did not vary much, from 50.0 to 52.6. The density in grams per cubic centimeter was between 3.8 and 4.1 approximately.

Figure 3:
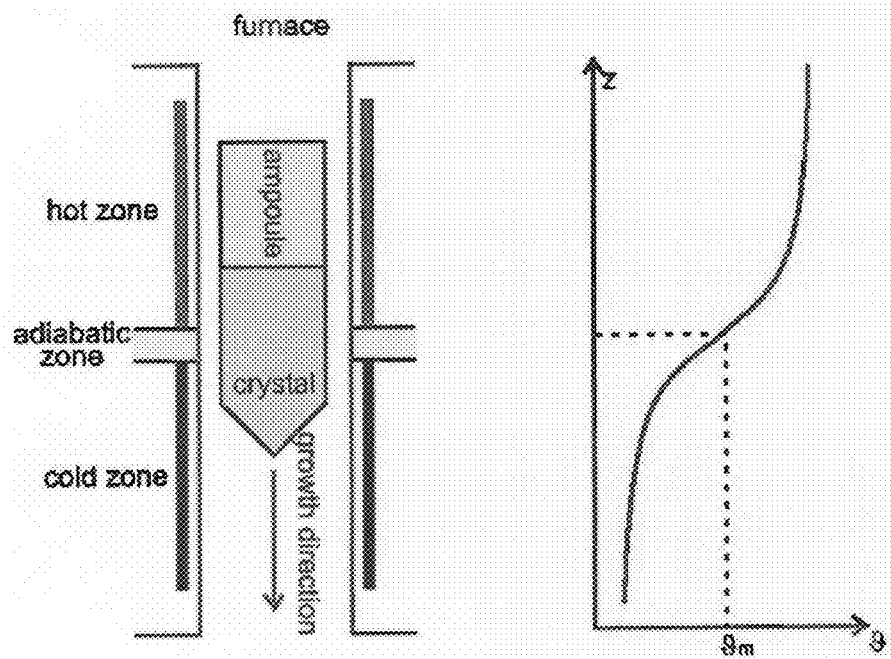
FIG. 3 shows typical Bridgman apparatus in diagrammatic form comprising from top to bottom, a hot zone, an adiabatic zone and a cold zone whereby the center of the furnace shows crystal growth direction from an ampoule in the hot zone.

The vertical gradient freeze, a Bridgman method and a modified Bridgman technique depicted in FIG. 3 may be used to form the crystals whose characteristics are described in table 1. The method may also be used with or as a substitute for a vertical gradient freeze (VGF) method. A Czochralski technique or combined Czochralski/Bridgman technique may be used in the alternative to grow scintillator crystals. As explained above, halide salts are moisture sensitive. One step in the process is to synthesize the compound using high purity anhydrous starting halides such as CsI, KI, RbI, EuI$_2$ and CaI$_2$. In the case of RbI, the salt was dried and purified in a glove box using known techniques. It is recommended that the dry salt raw materials be handled in a glove box prior to movement to the ampoule of FIG. 3. A typical ampoule is a vacuum-sealed quartz ampoule at 10$^{-6}$ vacuum pressure. A Mellen Electro-Dynamic Gradient (EDG) furnace with a translation motor may be utilized to generate heat. Synthesized material may be further purified via filtering through a frit followed by several runs of zone refining. Growth parameters are suggested as follows: a temperature gradient may be between 25-75° C. per inch of crystal growth; a translation rate may be one millimeter per hour (range of 0.5 to 2 mm per hour); a typical cool down rate may be 5° C. per hour. Crystal growth results are shown in FIG. 8 against rulers showing length of growth.

In addition to growth in single crystalline form, the scintillator compounds discussed herein may be prepared as polycrystalline powders by mixing fine grain powder components in stoichiometric ratios and sintering at a temperature somewhat below the melting point. Furthermore, these compositions may be synthesized in polycrystalline ceramic form by hot isostatic pressing of lute grained powders.

Figure 4:
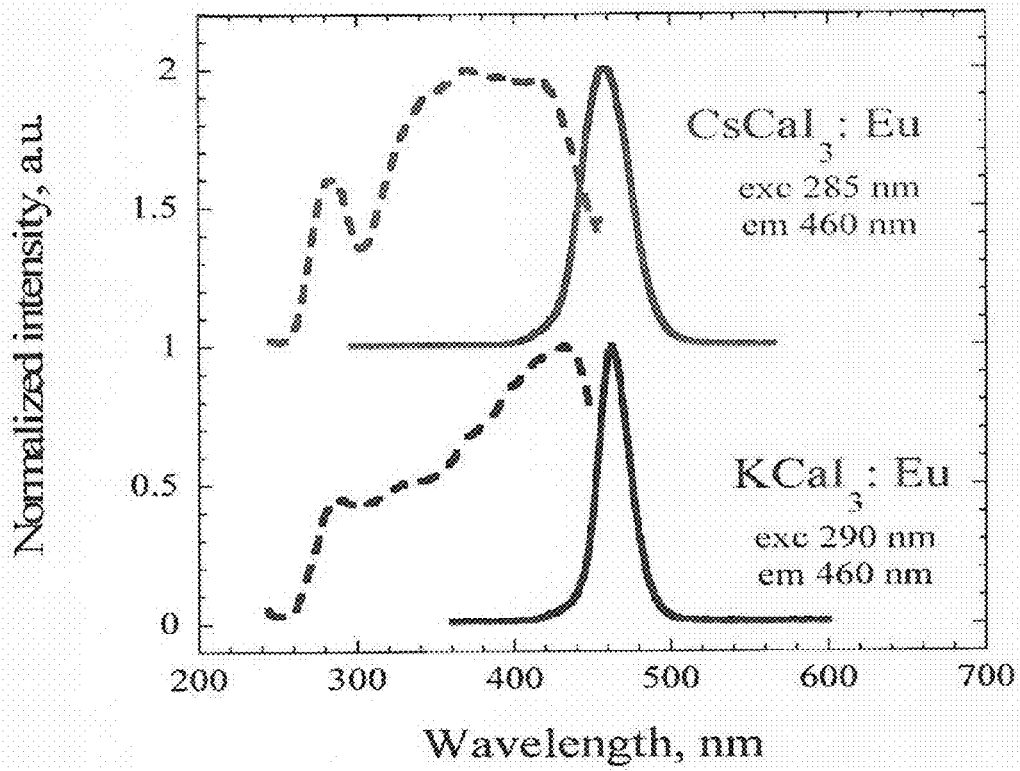
FIG. 4 provides a graph for photoluminescence emission and excitation spectra for $CsCaI_3$:Eu and $KCaI_3$:Eu wherein dashed lines represent wide excitation bands and solid lines represent emission bands for each crystal.

Referring now to FIG. 4, there is shown a graph for CsCaI$_3$ and KCaI$_3$ with excitation at 285, 290 nm wavelength (in dashed line) and emission at 460 nm wavelength for each crystal (in solid line) shown as the respective peaks. Intensity levels are shown in the vertical axis as normalized intensity. A Flourolog3 lifetime spectrofluorometer (horiba Jobin Yvon) was used in the measurements. Emissions and excitation bands are characteristic of Eu$^{2+}$ 5d to 4f luminescence. The Ca$^{2+}$ ion provides a substitution site for Eu$^{2+}$ doping. The characteristic data confirms incorporation of Eu$^{2+}$ into the lattice of each crystal scintillator in the stable divalent state as a substitute for calcium. Moreover, Eu$^{2+}$ doping is confirmed to demonstrate excellent luminosity and high spectral energy resolution at normal room temperatures. CsCaCl$_3$ and CsCaI$_3$ are discussed in some detail in "Theoretical and experimental characterization of promising new scintillators: Eu$^{2+}$ CsCaCl$_3$ and CsCaI$_3$," J. App. Phys. 113, 203504 (2013) of Tyagi, Zhuravleva et al. and also in "New single crystal scintillators: CsCaCl$_3$:Eu and CsCaI$_3$:Eu," Journal of Crystal Growth 352 (2012) pp. 115-119 incorporated by reference as to their entire contents.

Figure 5:
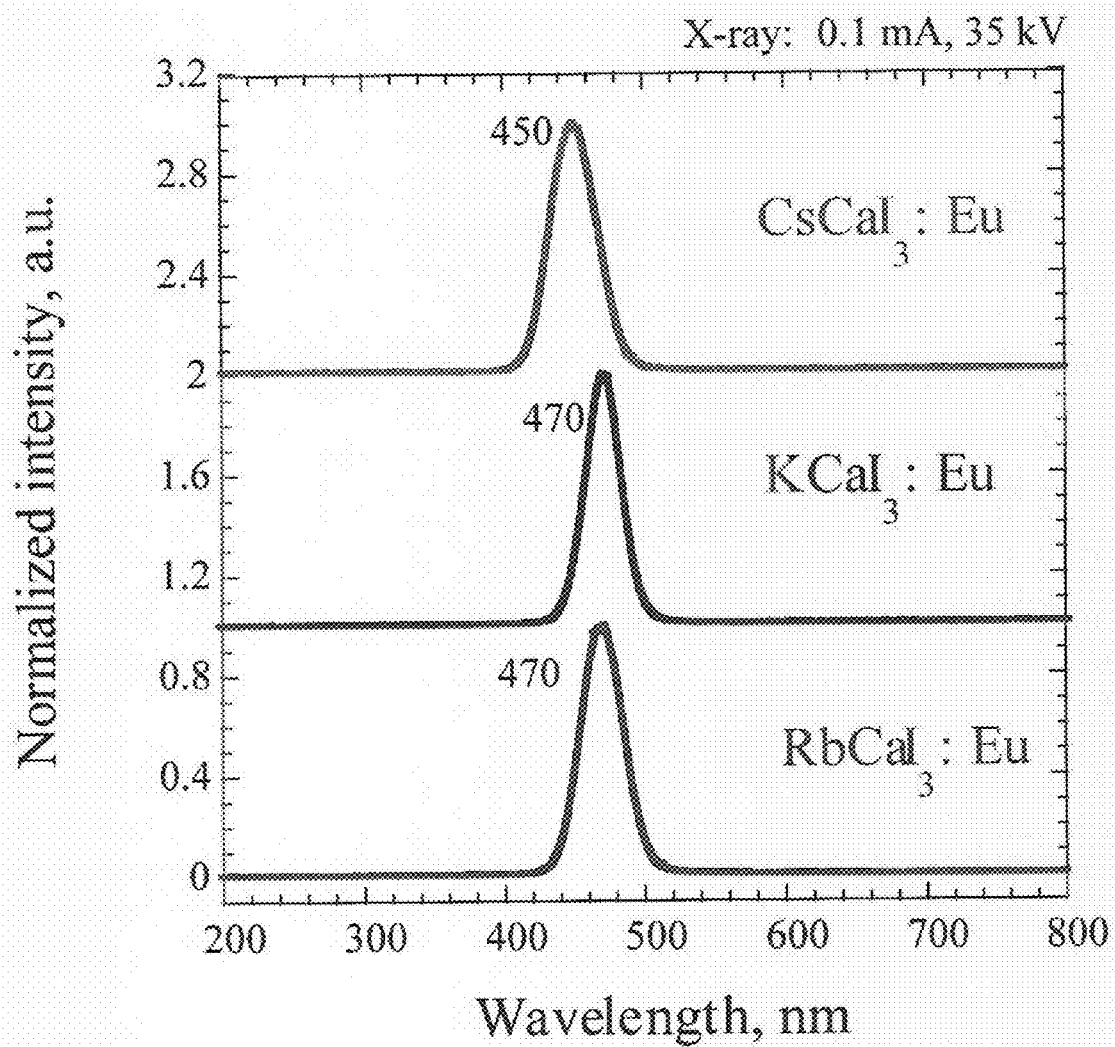
FIG. 5 provides graphs for radio-luminescence for each crystal: $CsCaI_3$:Eu, $KCaI_3$:Eu, and $RbCaI_3$:Eu, demonstrating $Eu^{2+}$ 5d-4f luminescence under X-ray excitation.

Referring to FIG. 5, there are shown graphs for X-Ray radioluminescence spectra for each crystal: CsCaI$_3$:Eu, KCaI$_3$:Eu, and RbCaI$_3$:Eu where the emission peak maxima are at 450, 470 and 470 nm respectively and normalized intensity shown as the vertical axis as before. Radioluminescence spectra were measured at room temperature under continuous irradiation from an X-ray generator (35 kV and 0.1 mA). Again, the emission bands are characteristic of Eu$^{2+}$ 5d-4f luminescence. The emission is suitable for use with conventional photodetectors known in the art such as photomultiplier tubes (PMT's), for example, a Photonis XP2020Q PMT and fast timing electronics.

Figure 6:
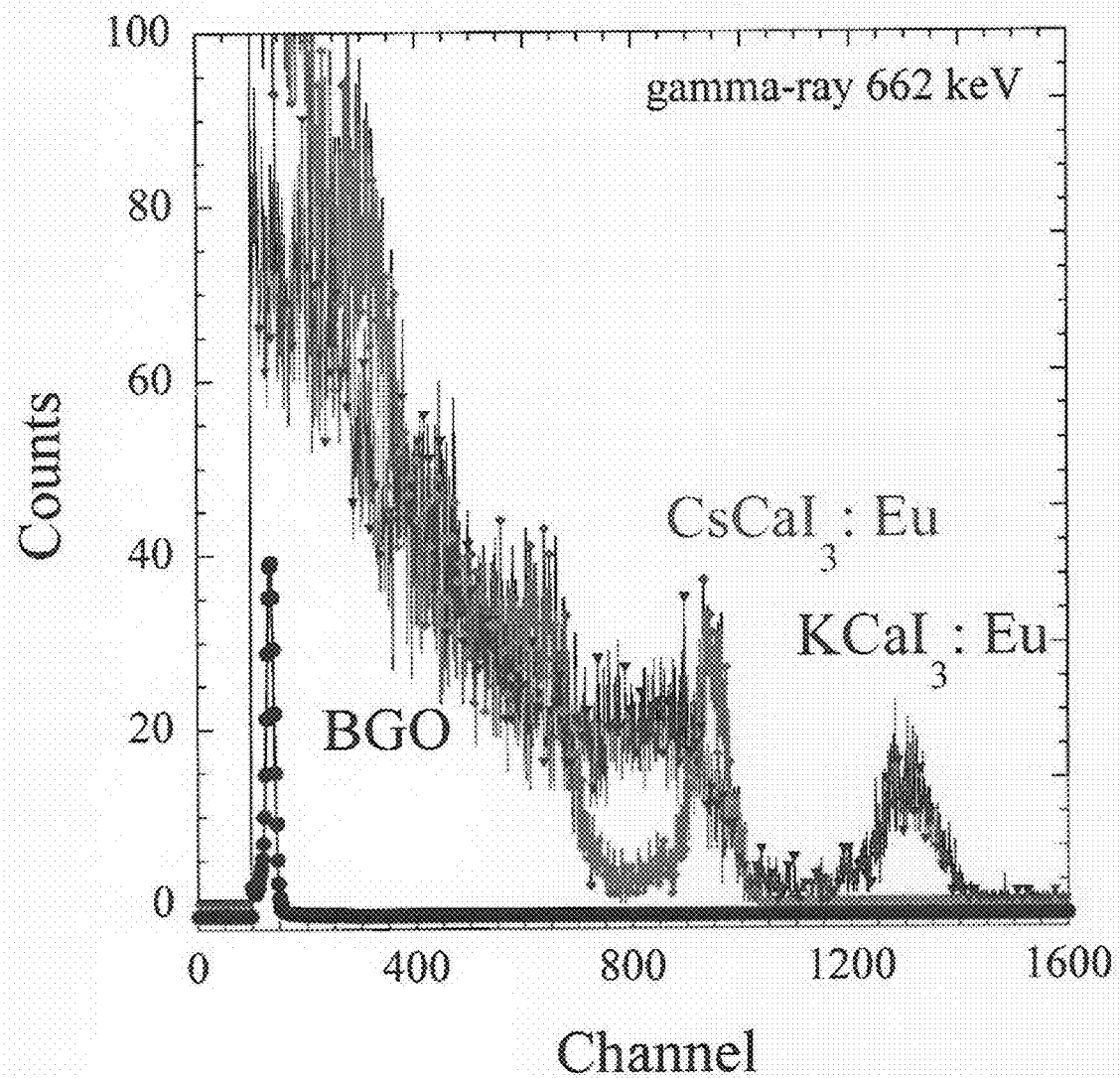
FIG. 6 provides $^{137}Cs$ energy spectra with 662 keV gamma-ray photopeaks for $CsCaI_3$:Eu 3% (the upper curve) and $KCaI_3$:Eu 3% (the lower curve) normalized to a benchmark bismuth germanate (BGO) standard sample with its photopeak at channel 100.

Referring now to FIG. 6, there is shown $^{137}$Cs gamma-ray energy spectra for the CsCaI$_3$:Eu 3% and KCaI$_3$:Eu 3% crystals. Light output measurements were carried out on samples covered in mineral oil and directly coupled to a photomultiplier tube (PMT) and covered with Teflon tape. A Hamamatsu H3177-50 PMT may be used for the absolute light measurements. Gamma-ray energy spectra were recorded using a $^{137}$Cs source with a 6 μsec shaping time. Both the CsCaI$_3$:Eu 3% (generally upper, side-wise square) and KCaI$_3$:Eu 3% (generally lower, triangle pointing down) scintillator crystal spectra exhibit the position of a 662 keV gamma-ray photopeak at a much higher channel number than a benchmark bismuth germanate (BGO) crystal with its photopeak at channel 100, indicating much higher light output. While different Eu doping was used between 1 and 10 mol %, an optimal Eu$^{2+}$ activator concentration was found to be 3 mol %.

The photo peaks in FIG. 6 were fitted with Gaussian functions to determine the centroid of the peak and the energy resolution. The integral quantum efficiency of the PMT according to the emission spectrum of the scintillators was used to estimate the light output in photons per unit gamma ray energy. Table 2 below shows the absolute light output and energy resolution for the particular samples used for the measurements compared to a NaI:Tl reference sample. The energy resolution at 662 keV was determined from the full width at half maximum (FWHM) of the 662 keV photopeak.

TABLE 2

| Composition | Light yield, photons/MeV | Energy resolution, %@662 keV |
|---|---|---|
| KCaI$_3$:Eu 3% | 60,000 | 5 |
| CsCaI$_3$:Eu 3% | 38,500 | 7 |
| RbCaI$_3$:Eu 3% | No gamma-ray photo peak | NA |
| NaI:Tl | 38,000 | ~7 |

As can be seen from the table 2, the RbCaI$_3$:Eu 3% sample did not provide a resolved gamma-ray photo peak. On the other hand, the KCaI$_3$:Eu 3% crystal greatly exceeded the benchmark NaI:Tl crystal at a light yield of 60,000 photons per MeV compared with 38,000 for NaI:Tl while the CsCaI$_3$:Eu 3% crystal matched, if not, exceeded the NaI:Tl light yield. As for energy resolution, both the KCaI$_3$:Eu 3% and CsCaI$_3$:Eu 3% crystals exhibited a very acceptable range between 5% (for potassium) and 7% for cesium at 662 keV.

Figure 7A:
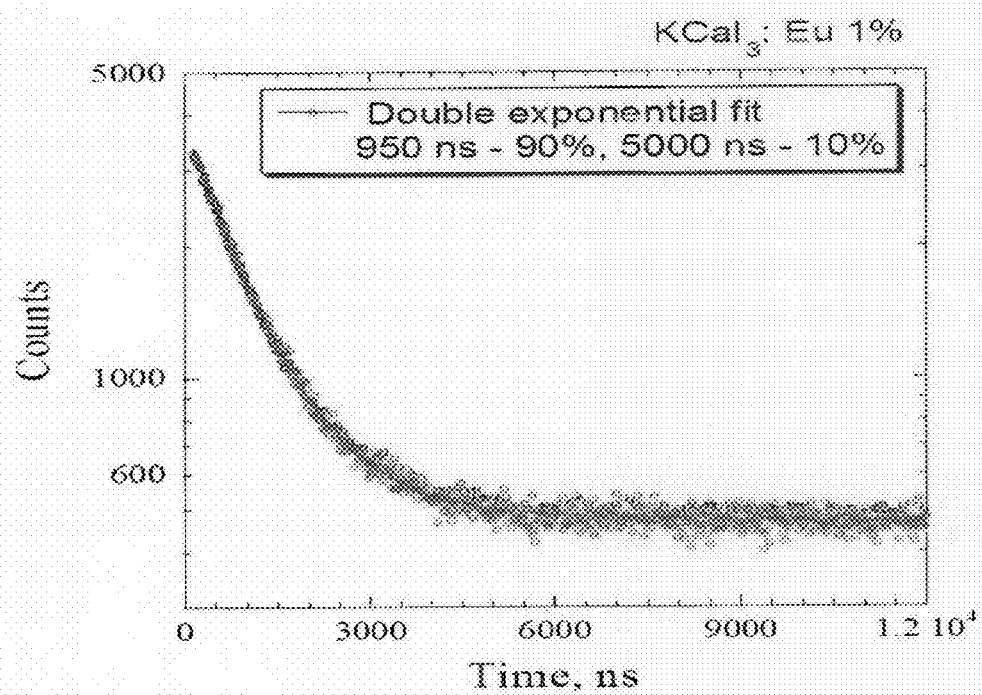
FIG. 7A to 7C provides graphs of scintillation decay for each crystal $KCaI_3$:Eu 1%, $RbCaI_3$:Eu 1% and $CsCaI_3$:Eu 1% in counts over time measured in nanoseconds. Scintillation time profiles were recorded using a $^{137}Cs$ gamma-ray source. Scintillation decay constants obtained from fitting the curves with exponential functions are shown in legends.
Figure 7B:
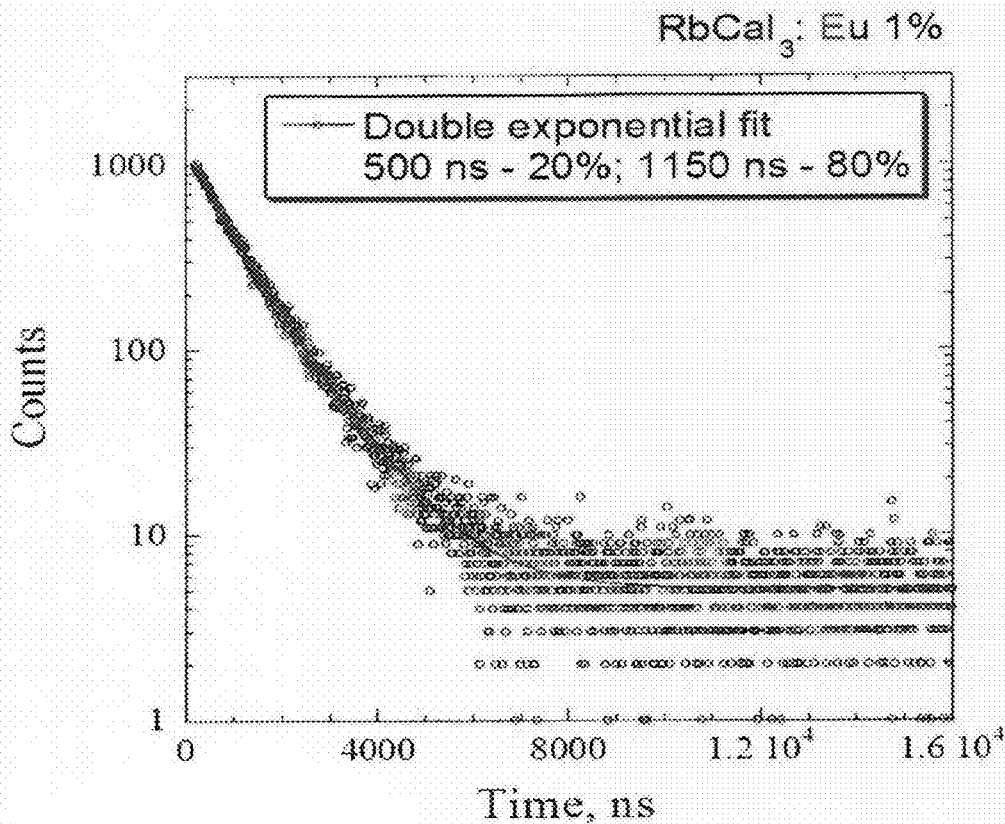
Figure 7C:
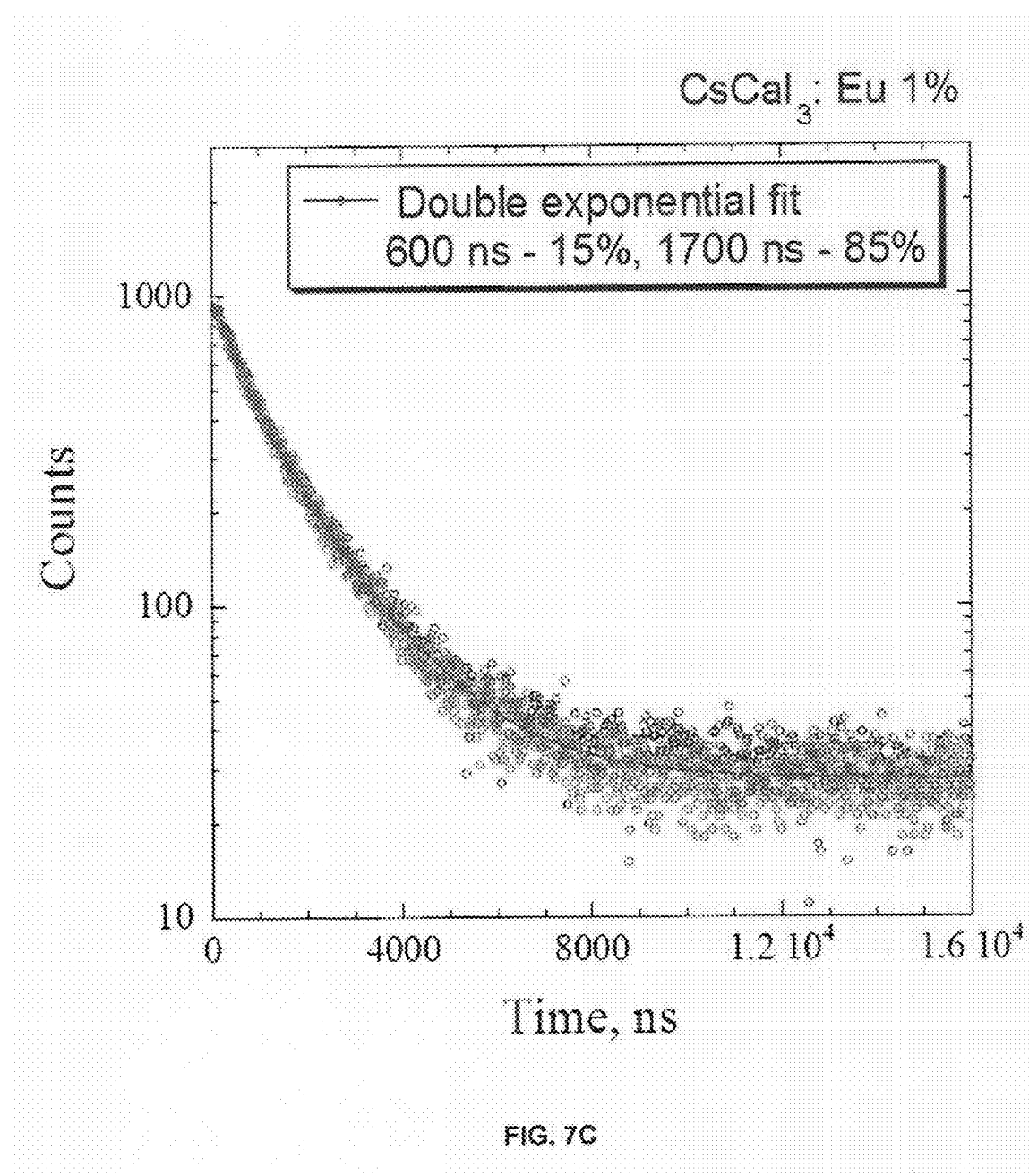

Scintillation decay is shown in FIGS. 7A through 7C for each crystal: where FIG. 7A represents KCaI$_3$:Eu 1%; FIG. 7B represents RbCaI$_3$:Eu 1% and FIG. 7C represents CsCaI$_3$:Eu 1% scintillation decay results in counts over time. Scintillation decay was measured using a time-correlated single photon counting technique and using a $^{137}$Cs 662 keV gamma-ray source. Scintillation decay constants obtained from fitting the curves with exponential functions are shown in legends. A primary decay around one μsecond is characteristic of Eu$^{2+}$ 5d to 4f luminescence.

Figure 8A:
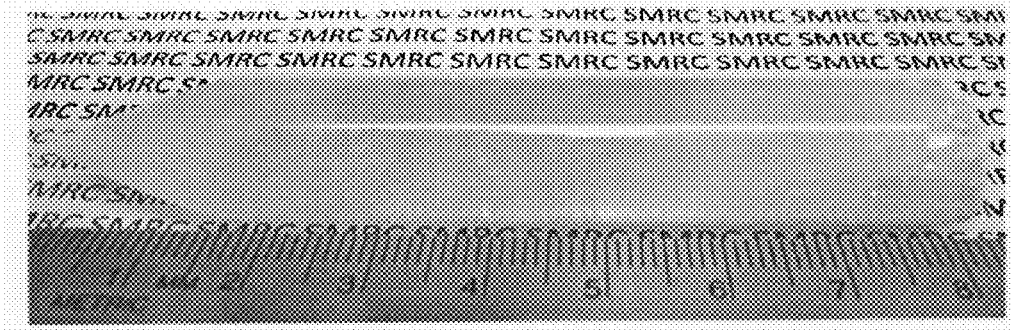
FIG. 8A to 8C provides black and white line drawings made from photographs of the $KCaI_3$:Eu 3%, $CsCaI_3$:Eu 3% and $RbCaCl_3$:Eu 3% crystals respectively compared with measurement rulers (except $RbCaCl_3$:Eu 3%).
Figure 8B:
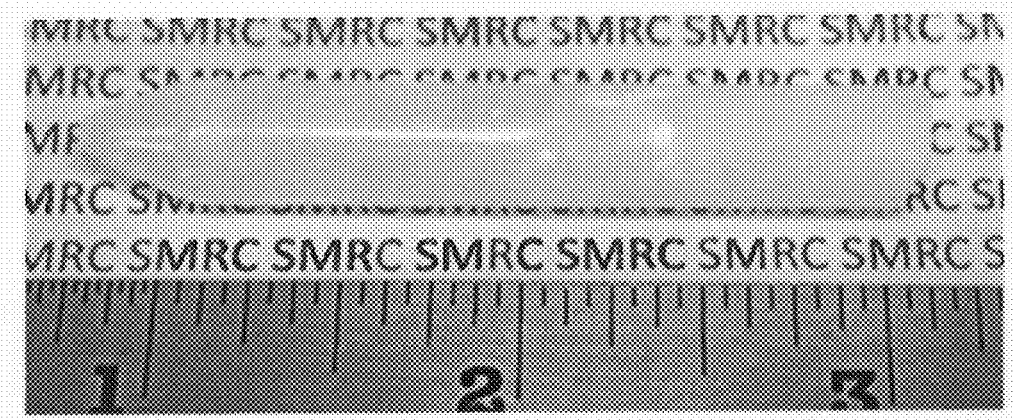
Figure 8C:
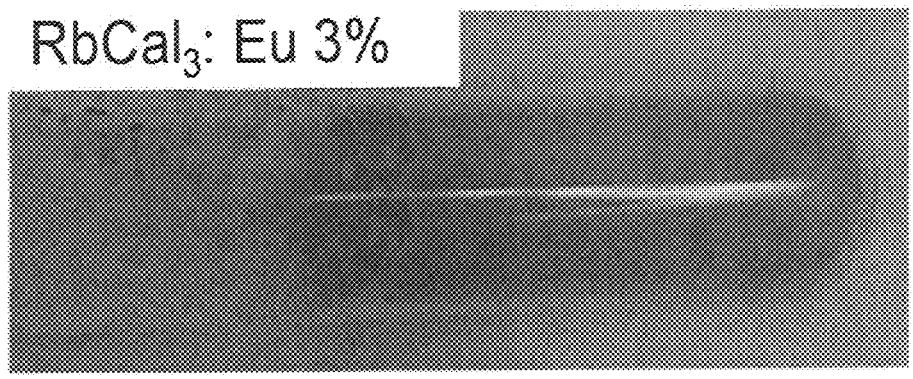

Referring now to FIG. 8A, there are shown black and white line drawings prepared from photographs of a KCaI$_3$:Eu 3% crystal compared with a metric ruler. All the single crystals depicted in the drawings herein are crack-free and are greater than 0.1 cm in one dimension. The lengthwise ruler indicates that the potassium crystal was grown to a length of over six centimeters and measured approximately 0.5 centimeters in width. Referring now to FIG. 8B, there are shown black and white line drawings prepared from photographs of a CsCaI$_3$:Eu 3% crystal compared with a ruler. A CsCaI$_3$:Eu 1% single crystal is depicted as FIG. 2 of U.S. Ser. No. 61/443,076 filed Feb. 15, 2011, incorporated herein by reference as to its entirety. The lengthwise ruler in inches indicates that the cesium crystal was grown to a length of over two inches and measured approximately 0.5 centimeters in width. CsCaCl$_3$ and CsCaI$_3$ are discussed in some detail in "Theoretical and experimental characterization of promising new scintillators: Eu$^{2+}$ CsCaCl$_3$ and CsCaI$_3$," J. App. Phys. 113, 203504 (2013) of Tyagi, Zhuravleva et al. and also in "New single crystal scintillators: CsCaCl$_3$:Eu and CsCaI$_3$:Eu," Journal of Crystal Growth 352 (2012) pp. 115-119 incorporated by reference as to their entire contents. Referring now to FIG. 8C, there is shown a black and white line drawing prepared from a photograph of a RbCaI$_3$:Eu 3% crystal.

The following table 3 provides a summary of results for CsCaI$_3$:Eu 3% and KCaI$_3$:Eu 3% crystals compared with those of a benchmark NaI:Tl crystal:

TABLE 3

| Composition | $T_m$, °C. | Crystal structure | Density g/cm$^3$ | $Z_{eff}$ | Max RL, nm | Primary sc, decay μs | LO, photons per MeV | Hygroscopic? |
|---|---|---|---|---|---|---|---|---|
| CsCaI$_3$:Eu 3% | 686 | orthorhombic | 4.06 | 52.6 | 450 | 1.7 | 38,500 | yes |
| KCaI$_3$:Eu 3% | 524 | orthorhombic | 3.81 | 50.6 | 470 | .95 | 60,000 | yes |
| NaI:Tl | 651 | cubic | 3.67 | 51 | 415 | .23 | 38,000 | yes |

In summary for this example, it is demonstrated that practical crystal growth comparable to NaI:Tl may be obtained at reasonable cost (involving congruent melting and acceptable melting point). Since the crystals are hygroscopic, hermetic packaging may be used with conventional photodetectors such as photo-multiplier tubes such as a Photonis XP2020Q PMT and fast timing electronics. X-ray, gamma-ray, and optical excitation have been demonstrated. With improved crystal quality (removal of raw material impurity and improved processing), both light output and energy resolution are expected to improve beyond their current levels.

Example 2

$CsA_{1-y}Eu_yX_3$ (where A=Ca, Sr, Ba, or a Combination Thereof and X=Cl, Br or I or a Combination Thereof) with Divalent Europium Doping where $0 \leq y \leq 1$ Now, single crystal inorganic crystal scintillators will be described of the formula $CsAX_3$ will be described with divalent Europium doping investigated as above between 1 and 10 mol % where A is calcium (Ca), strontium (Sr) or barium (Ba) or a combination thereof and X is a halide selected from chlorine, bromine or iodine. In particular, it will be shown that a crystal of $CsSrCl_3$:Eu 10% exhibits a light yield on the order of 46,000 photons per MeV and a scintillation decay at 2.6 μseconds and provides excellent gamma-ray and X-ray detection characteristics. The $A^{2+}$ lattice site provides a substitutional site for the $Eu^{2+}$ doping.

Figure 9A:
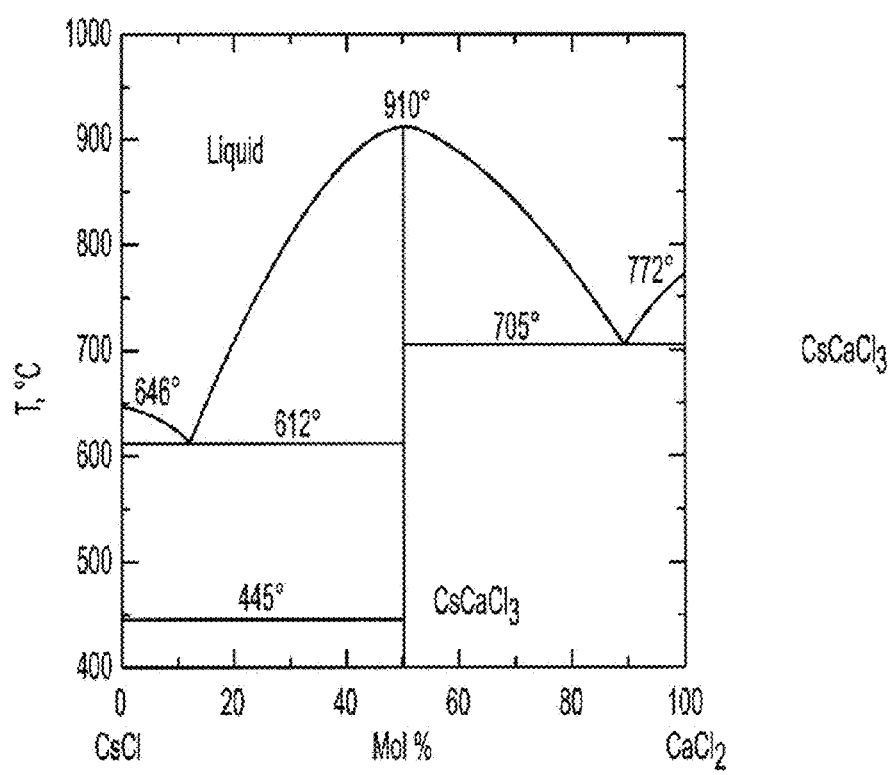
FIG. 9A is a PRIOR ART phase diagram of the CsCl—$CaCl_2$ system whereby CsCl is shown at left and $CaCl_2$ is shown at right between 0 and 100% mol concentration while temperature is depicted along the left vertical axis between 200° C. and 800° C.
Figure 9B:
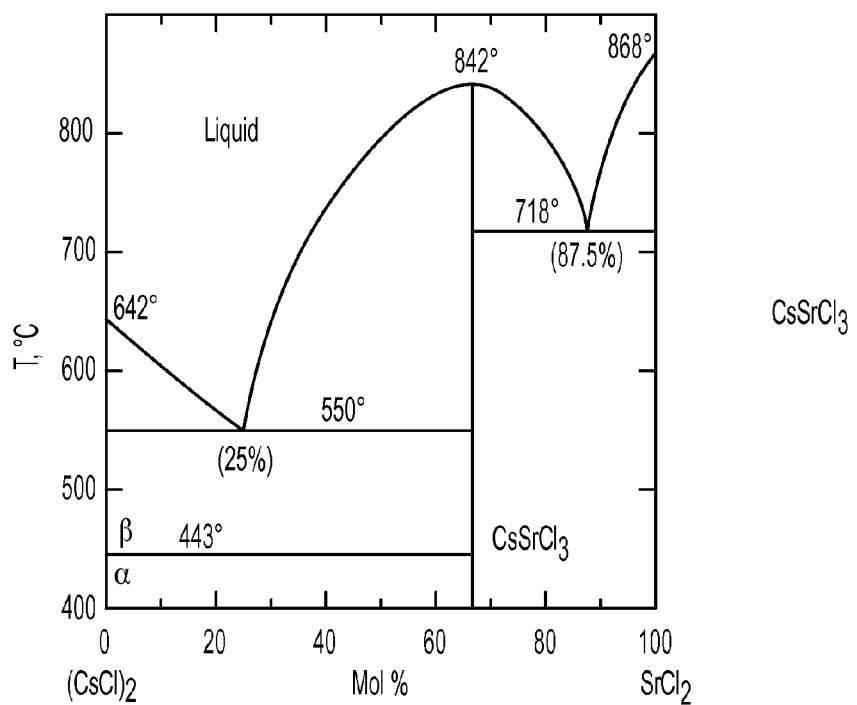
FIG. 9B is a PRIOR ART phase diagram of the CsCl—$SrCl_2$ system whereby CsCl is shown at left and $SrCl_2$ is shown at right between 0 and 100% mol concentration while temperature is depicted along the left vertical axis between 200° C. and 800° C.
Figure 9C:
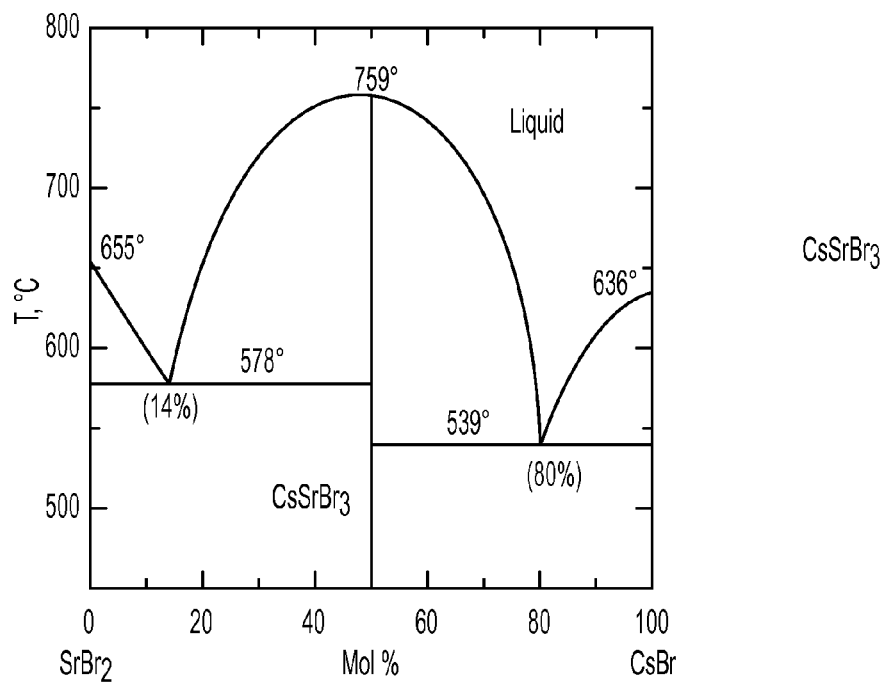
FIG. 9C is a PRIOR ART phase diagram of the $SrBr_2$—CsBr system whereby $SrBr_2$ is shown at left and CsBr is shown at right between 0 and 100% mol concentration while temperature is depicted, along the left vertical axis between 200° C. and 800° C. All three compounds, $CsCaI_3$, $CsSrI_3$ and $CsSrBr_3$ are congruently melting compounds and, therefore, their crystals can be grown from the melt.

Referring to FIGS. 9A to 9C, FIG. 9A shows a PRIOR ART phase diagram of the $CsCl-CaCl_2$ system whereby CsCl is shown at left and $CaCl_2$ is shown at right between 0 and 100% mol concentration while temperature is depicted along the left vertical axis between 200° C. and 800° C.; FIG. 9B is a similar PRIOR ART phase diagram of the $CsCl-SrCl_2$ system whereby CsCl is shown at left and $SrCl_2$ is shown at right; and FIG. 9C is a PRIOR ART phase diagram of the $SrBr_2-CsBr$ system whereby $SrBr_2$ is shown at left and CsBr is shown at right between 0 and 100% mol concentration while temperature is depicted along the left vertical axis between 200° C. and 800° C. Divalent europium was used primarily for doping as follows: $r(Eu^{2+})$= 1.20 A (CN=7); $r(Sr^{2+})$=1.21 A and $r(Ca^{2+})$=1.06 A. Perovskite type $ABX_3$ compounds were obtained by congruently melting and with practical crystal growth according to the methods discussed above and below.

Table 4, in part PRIOR ART, below provides a summary of the crystal growth for each scintillator crystal:

TABLE 4

| | $CsCaCl_3$:Eu 10% | $CsSrCl_3$:Eu 10% | $CsSrBr_3$:Eu 10% |
|---|---|---|---|
| Crystal structure at room temperature | Cubic | Orthorhombic | Orthorhombic |
| Melting point, ° C. | 910 | 842 | 760 |
| Density, g/cm³ | 3.0 | 3.06 | 3.76 |
| Phase transition, ° C. | 445 | 112, 443 | No |

A method of crystal growth has already been described above with respect to a discussion of FIG. 3. Bridgman crystal growth may comprise a gathering of anhydrous 99.99% pure raw materials. The materials may be further purified by vacuum drying and melt filtering. As described above, a quartz ampoule may be employed having, hot and cold zones whereby crystals may be grown under vacuum seal. A Mellen Electro-Dynamic Gradient (EDG) furnace with a translation motor may be utilized to generate heat. The crystal growth parameters may be the same as described above: temperature gradient at 75° C./inch, translation rate at one millimeter per inch and a cool down rate of 5° C. per hour (exemplary). The scintillator crystals were grown with spontaneous orientation. The ternary halide scintillators may be synthesized using vertical gradient freeze (VGF), Bridgman and melt synthesis and other techniques as suggested above.

Figure 10:
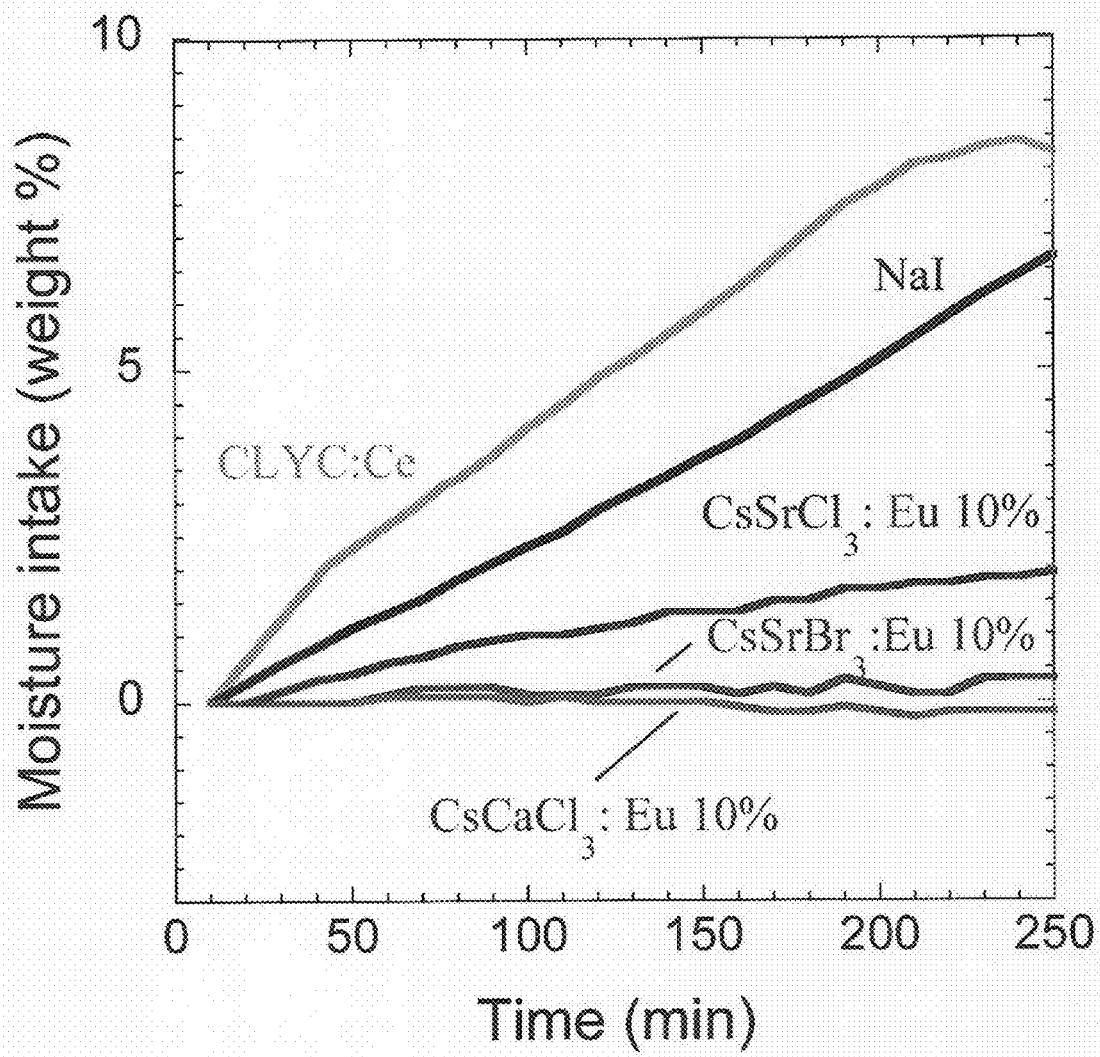
FIG. 10 is a graph over time of moisture intake of $Cs_2LiYCl_6$:Ce and NaI as benchmarks and the following crystals: $CsSrCl_3$:Eu 10%; $CsSrBr_3$:Eu 10% and $CsCaCl_3$:Eu 10% where the latter two crystals exhibit little or no moisture intake. Measurements were made at the same temperature and humidity conditions.

FIG. 10 is a graph over time of moisture intake of $Cs_2LiYCl_6$:Ce and NaI as benchmarks and the following crystals: $CsSrCl_3$:Eu 10%; $CsSrBr_3$:Eu 10% and $CsCaCl_3$:Eu 10% where the latter two crystals exhibit little or no moisture intake. $CsSrBr_3$:Eu 10% and $CsCaCl_3$:Eu 10% both exhibit practically flat moisture intake over a period of 250 minutes (over four hours). Moreover, $CsSrCl_3$ exhibits greatly improved moisture intake at 2% over four hours compared with NaI at over 6.5%. The samples were measured in a closed box with controlled environment at room temperature. All samples showed significantly lower moisture sensitivity compared to NaI and CLYC scintillators.

Figure 11:
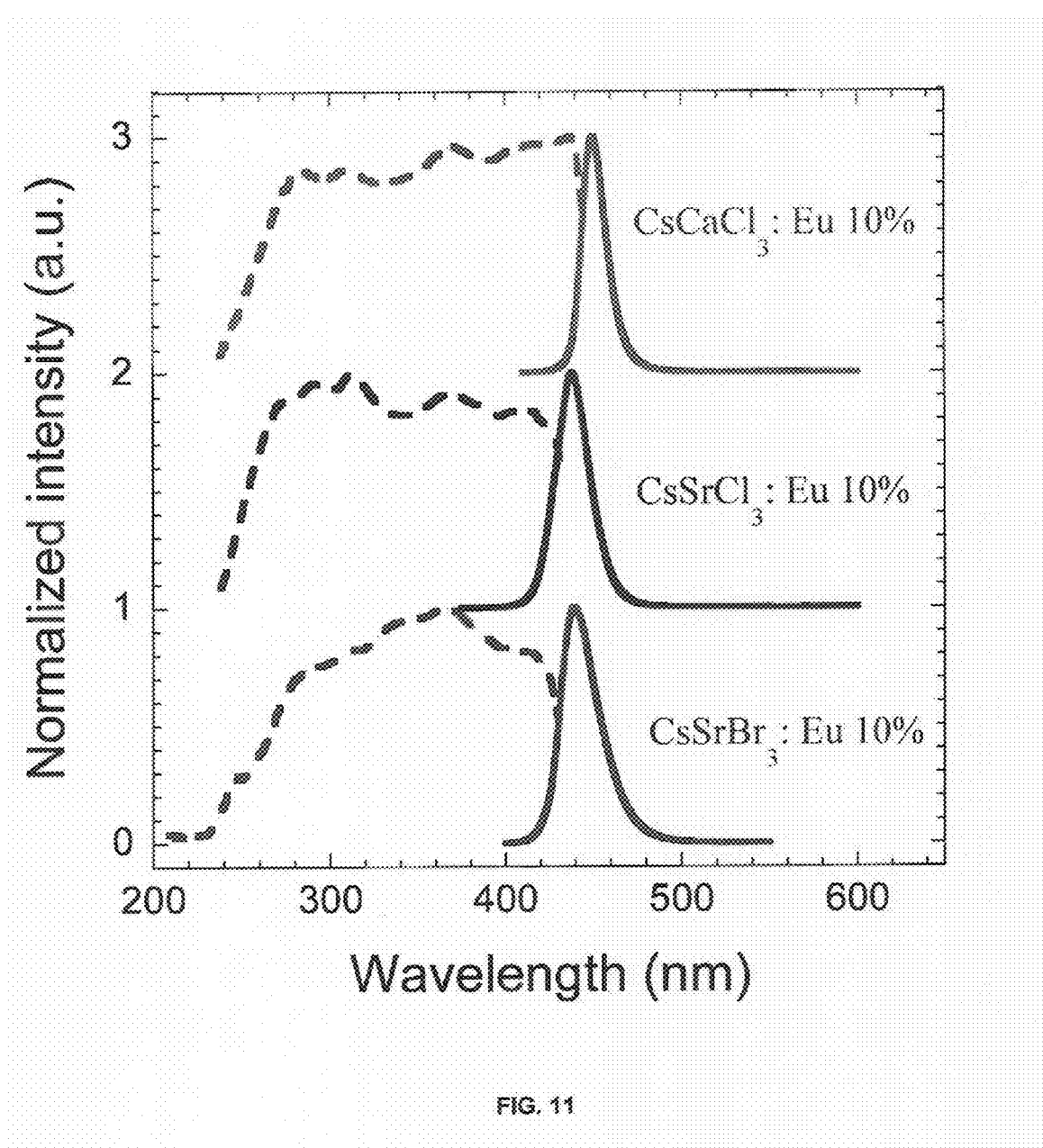
FIG. 11 is a photoluminescence emission and excitation spectra graph for each of the $CsCaCl_3$:Eu 10%, $CsSrCl_3$:Eu 10% and $CsSrBr_3$:Eu 10% crystals where dashed lines represent wide excitation bands and solid lines represent emission bands.

FIG. 11 represents photoluminescence spectra for each of the $CsCaCl_3$: 10%, $CsSrCl_3$:Eu 10% and $CsSrBr_3$:Eu 10% scintillator crystals where dashed lines represent wide excitation bands and solid lines represent emission bands. The emission and excitation bands are characteristic of $Eu^{2+}$ 5d to 4f luminescence. Incorporation of $Eu^{2+}$ is thus confirmed into the lattice structures in the stable divalent state of the crystals. Photoluminescence excitation and emission spectra may be measured with a Horiba Fluorolog 3 spectrofluorometer utilizing a Xe lamp excitation source and scanning monochromators. The following table 5 provides a summary of excitation (EXC) bands and emission (EM) bands:

TABLE 5

| Composition | EXC, nanometers wavelength | EM, nanometers wavelength |
|---|---|---|
| $CsCaCl_3$:Eu 10% | 278 to 440 nm | 450 nm |
| $CsSrCl_3$:Eu 10% | 270 to 430 nm | 439 nm |
| $CsSrBr_3$:Eu 10% | 270 to 430 nm | 440 nm |

Figure 12:
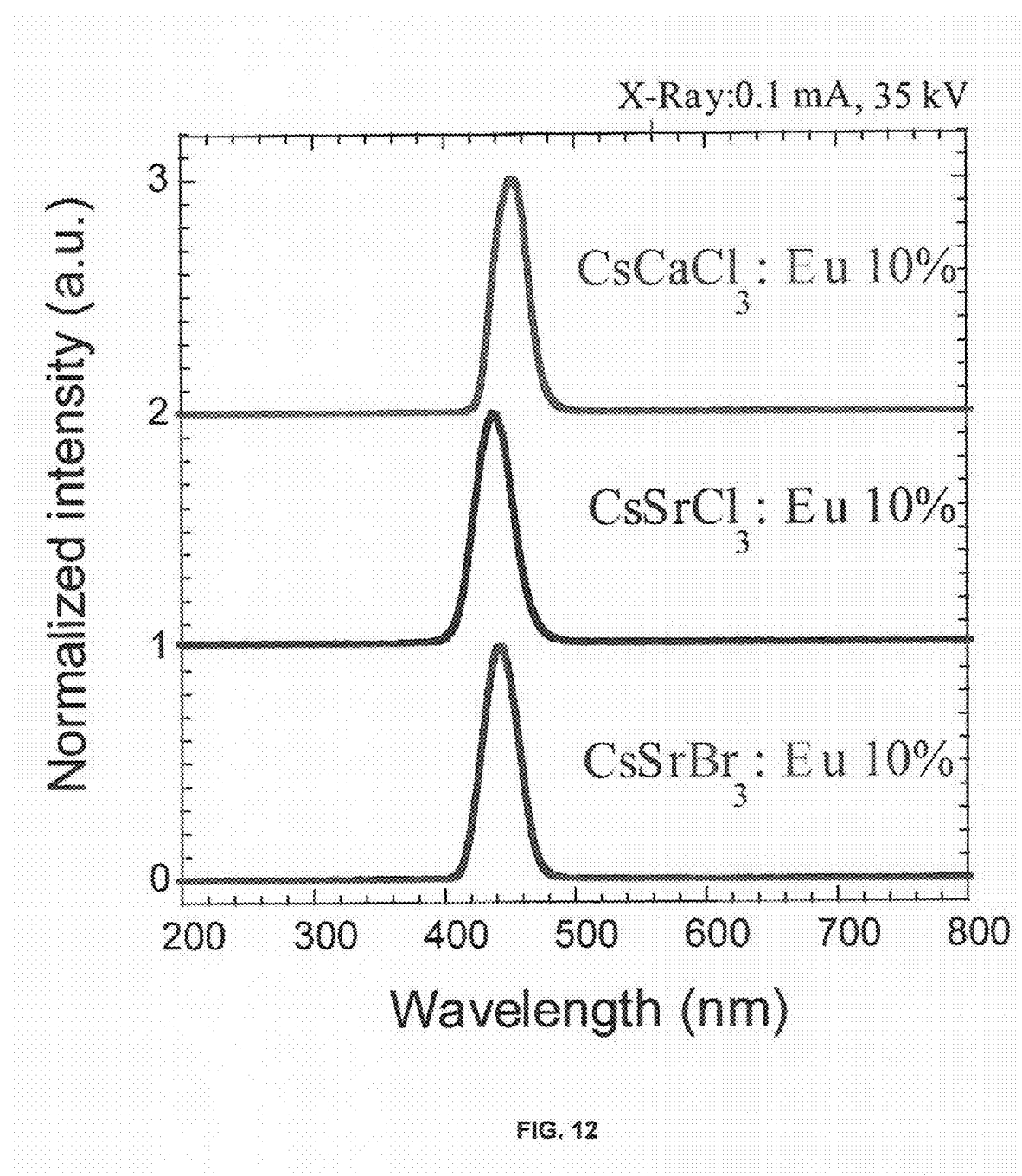
FIG. 12 provides graphs for radioluminescence for each crystal: $CsCaCl_3$:Eu 10%, $CsSrCl_3$:Eu 10% and $CsSrBr_3$:Eu 10% demonstrating $Eu^{2+}$ 5d-4f luminescence under X-ray excitation.

FIG. 12 is a graph of normalized intensity versus wavelength in nanometers of X-ray excitation of the $CsCaCl_3$: 10%, $CsSrCl_3$:Eu 10% and $CsSrBr_3$:Eu 10% scintillator crystals. Radioluminescence spectra were measured at room temperature under continuous irradiation from an X-ray generator (0.1 mA, 35 kV). An Acton monochromator may be used to resolve the spectrum as a function of wavelength. The graph demonstrates successful results of efficient radioluminescence under X-ray excitation. The emission bands are characteristic of $Eu^{2+}$ 5d-4f luminescence. The emission bands were at a wavelength suitable for capture using conventional photo detectors such as photo multiplier tubes (PMT's) such as a Photonis XP2020Q PMT and fast timing electronics. The measured emission peaks are as follows: for $CsCaCl_3$:Eu 10%, the peak was at 450 nm; for $CsSrCl_3$:Eu 10%, the peak was at 437 nm; and for $CsSrBr_3$:Eu 10%, the peak was at 443 nm.

Figures 13A, 13B:
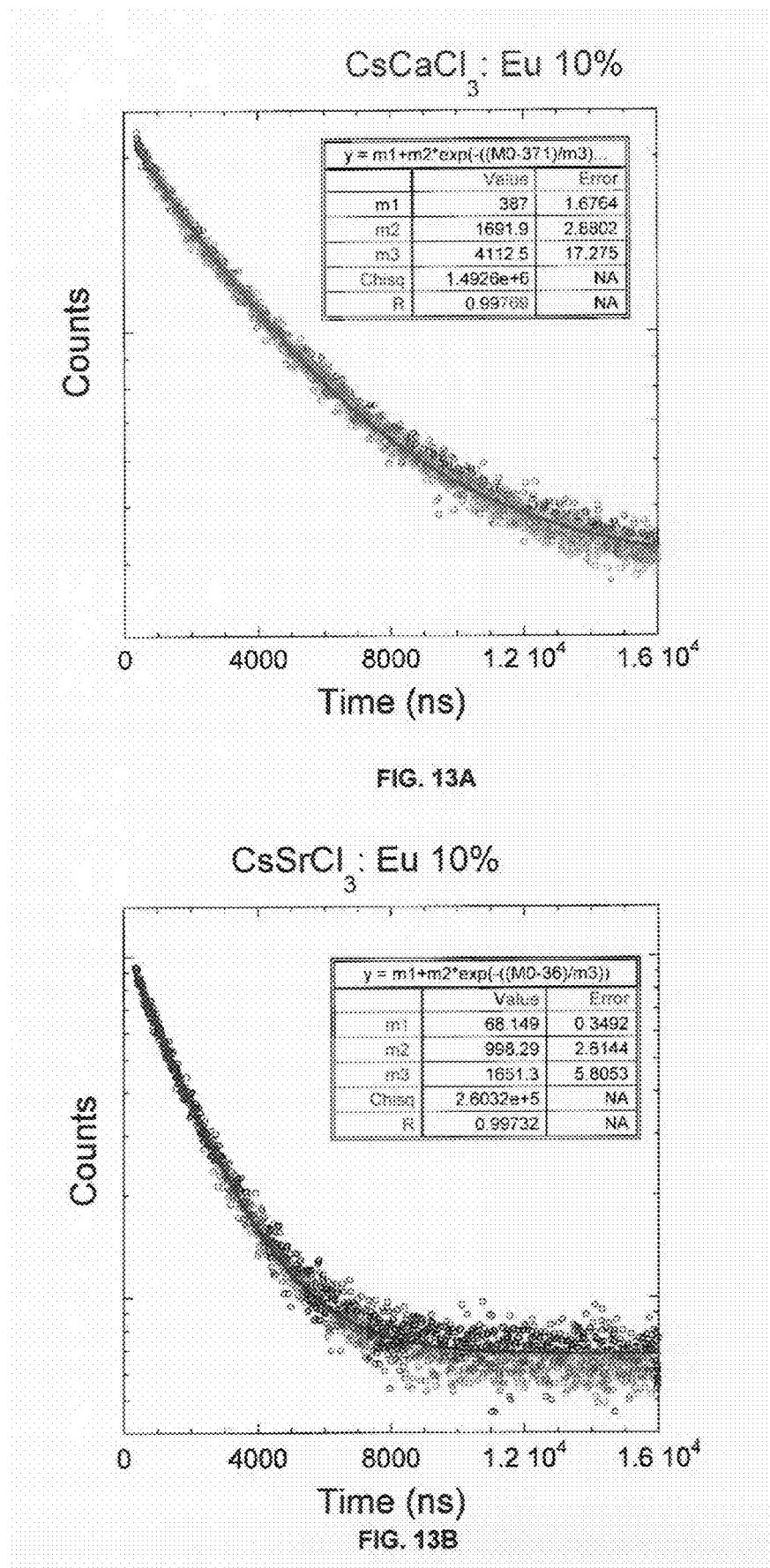
FIG. 13A to 13C represent graphs of scintillation decay over time for each crystal whereby
Figure 13C:
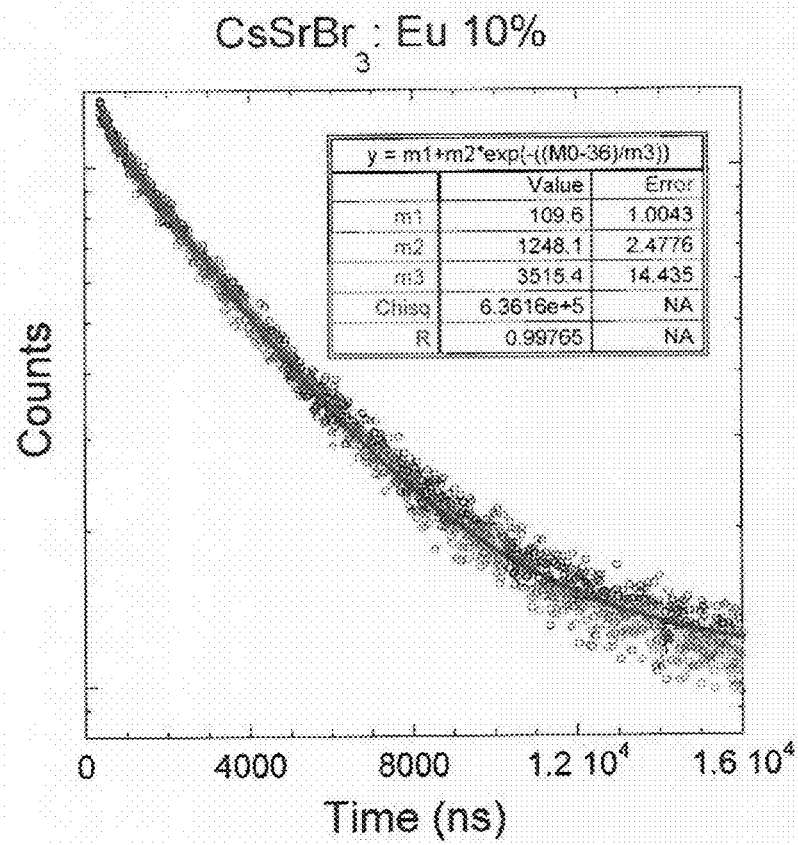

FIG. 13A to 13C represent graphs of scintillation decay over time for each crystal whereby FIG. 13A represents CsCaCl₃:Eu 10%; FIG. 13B represents CsSrCl₃:Eu 10% and FIG. 13C represents CsSrBr₃:Eu 10%. Scintillation time profiles were recorded using a $^{137}$Cs 662 keV gamma-ray source. Scintillation decay constants obtained from fitting the curves with exponential functions are shown in legends. The primary decay around 2-4 μseconds is characteristic of $Eu^{2+}$ 5d to 4f luminescence. The measured scintillation decay times were measured as follows: for CsCaCl₃:Eu 10%, the decay time was at 4.1 μseconds; for CsSrCl₃:Eu 10%, the decay time was at 2.6 μseconds (the fastest); and for CsSrBr₃:Eu 10%, the decay time was at 3.5 μseconds.

Figure 14A:
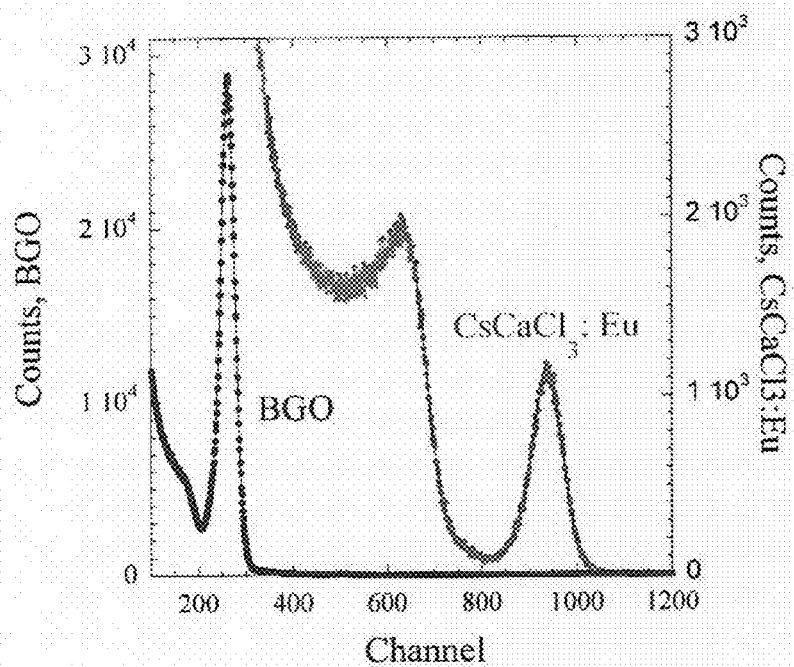
FIG. 14A to 14C represent graphs of $^{137}$Cs energy spectra with 662 keV gamma-ray photopeaks for each crystal whereby
Figure 14B:
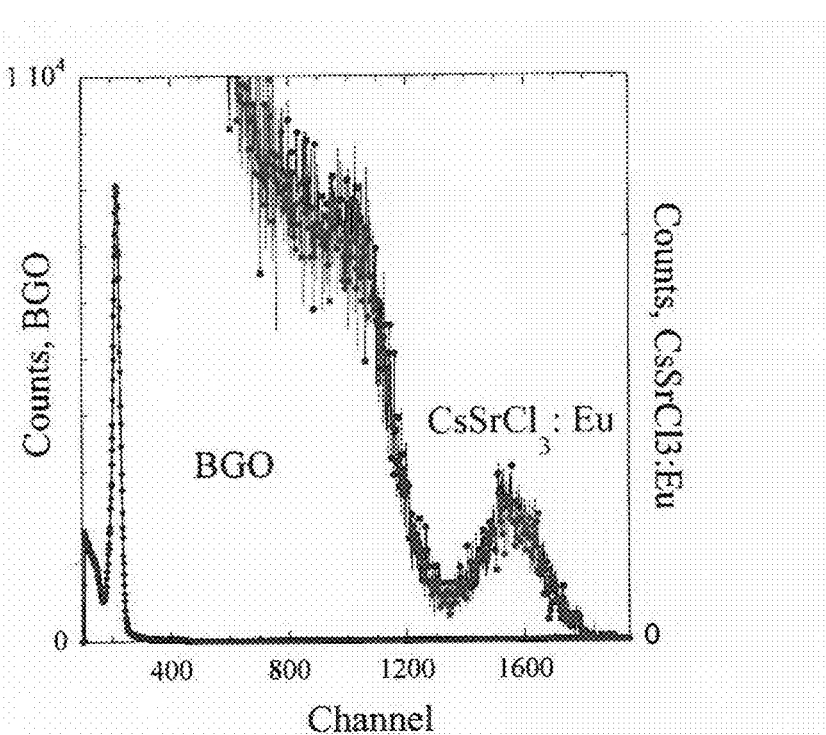
Figure 14C:
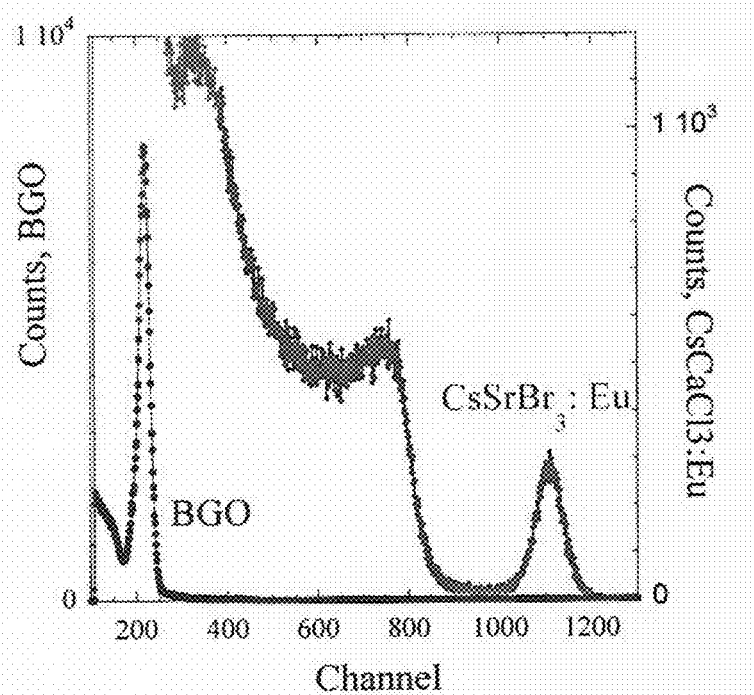

FIG. 14A to 14C represent graphs of $^{137}$Cs gamma-ray emission spectra for each crystal whereby FIG. 14A represents CsCaCl₃:Eu 10%; FIG. 14B represents CsSrCl₃:Eu and FIG. 14C represents CsSrBr₃:Eu normalized to benchmark bismuth germanate (BGO) with its photopeak at channel 100. Efficient scintillation characteristics were exhibited under excitation by ionizing radiation with respect to all three crystals. The following table 6 provides light yield and energy resolution for each crystal compared with NaI:Tl as a benchmark:

TABLE 6

|  | CsCaCl₃:Eu 10% | CsSrCl₃:Eu 10% | CsSrBr₃:Eu 10% | NaI:Tl |
| --- | --- | --- | --- | --- |
| Light yield, ph/MeV | 18000 | 46000 | 31000 | 38000 |
| Energy resol. @ 662 keV, % | 8.9 | >10 | 6.7 | 7.1 |

As can be seen by the results, CsSrCl₃:Eu 10% demonstrates improved light yield over known NaI:Tl.

Figure 15A:
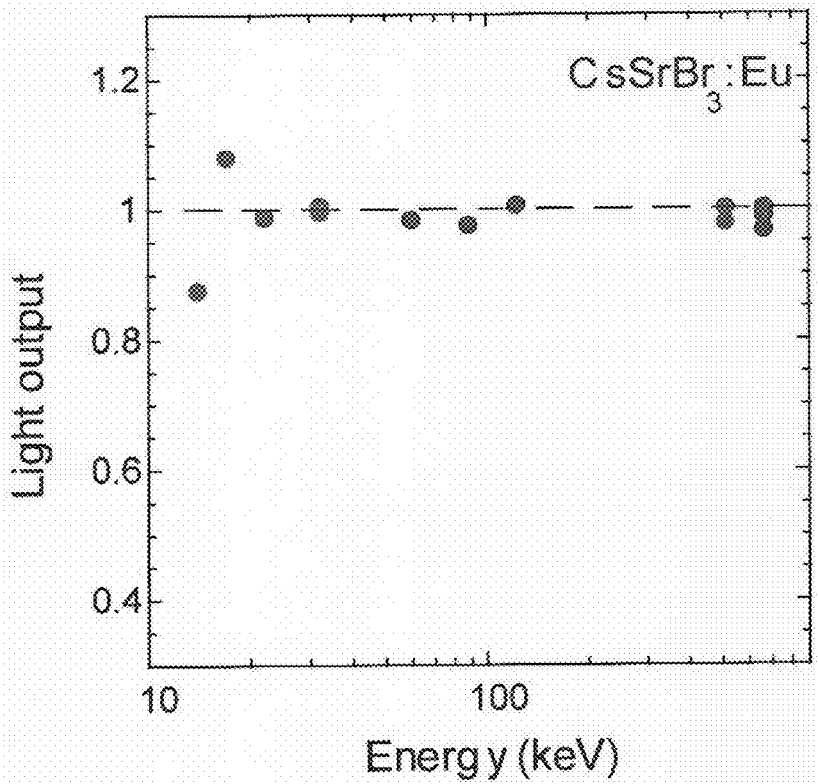
FIG. 15A to 15B are graphs demonstrating relative light output proportionality versus energy whereby
Figure 15B:
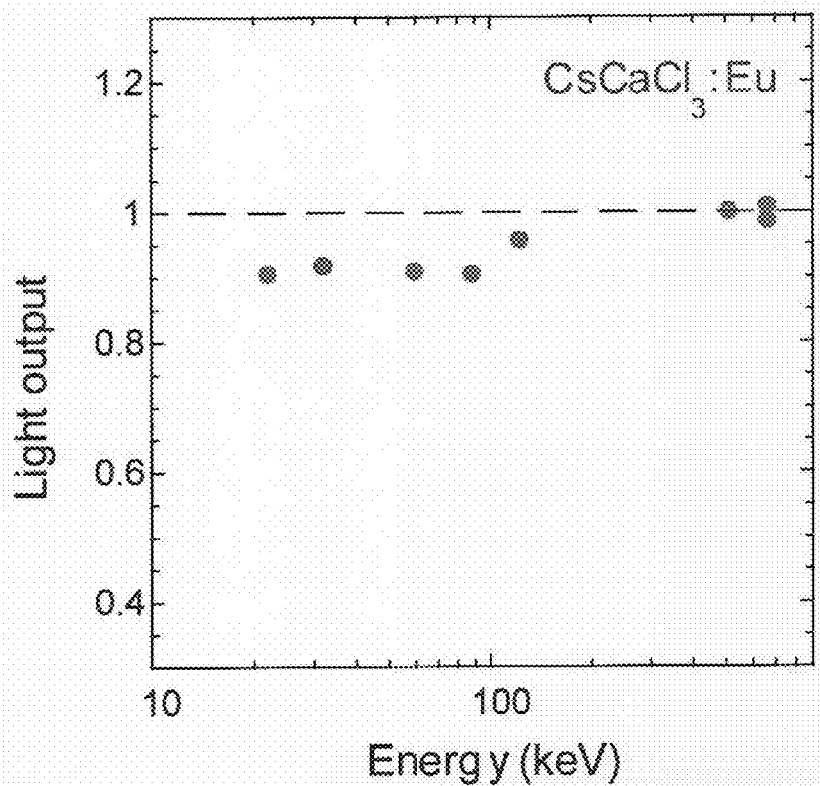

FIG. 15A to 15B are graphs demonstrating light output proportionality whereby FIG. 15A is a graph of light output per keV versus energy in keV for CsSrBr₃:Eu and FIG. 15B is a similar graph for CsCaCl₃:Eu. The importance of FIG. 15 is that good proportionality contributes to good energy resolution as these graphs demonstrate good proportionality for light output per keV over a wide range of energy level from 10 to 1000 keV.

Figure 16A:
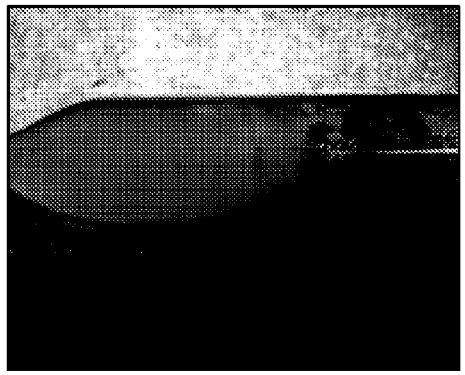
FIG. 16A to 16C are black and white line drawings made from photographs of each respective crystal: CsSrCl$_3$:Eu 10%; CsSrBr$_3$:Eu 10% and CsCaCl$_3$:Eu 10%.
Figure 16A:
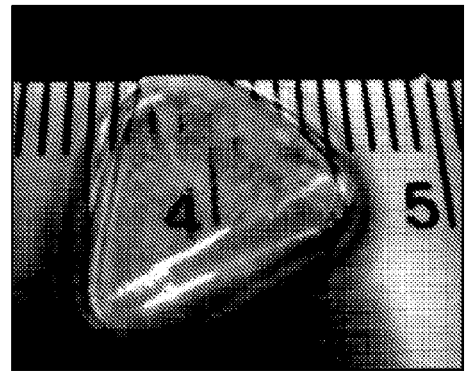
Figure 16B:
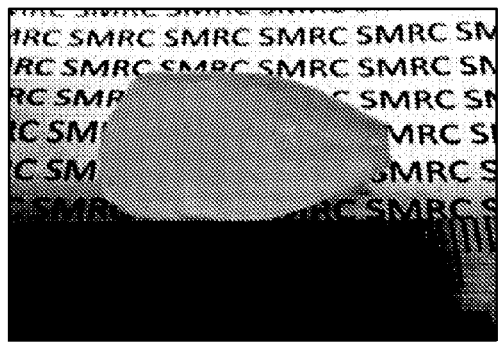
Figure 16B:
Figure 16C:
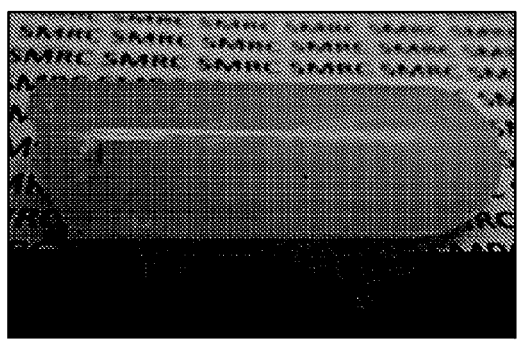
Figure 16C:
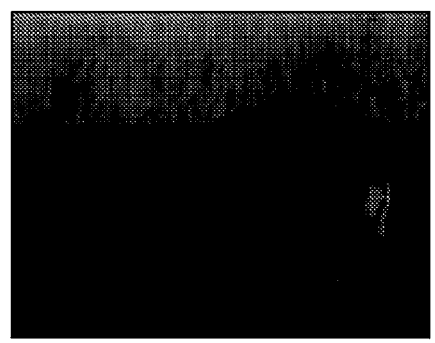

FIG. 16A to 16C are black and white line drawings made from photographs of each respective crystal: CsSrCl₃:Eu 10%; CsSrBr₃:Eu 10% and CsCaCl₃:Eu 10%. CsSrCl₃:Eu 10% was grown to be about two inches long; however, some cracking may be seen, possibly due to phase transitions. Doping at 1% Eu is studied in U.S. Ser. No. 61/491,074 filed May 27, 2011 by the same inventors and incorporated by reference as to its entire contents. Single crystal samples at Eu 1% doping are shown of CsSrBr₃ in FIG. 1 and of CsCaCl₃ at Eu 1% doping in FIG. 8. Gamma ray and X-ray scintillation properties of each are provided. The crystals are about one centimeter in cross-section. CsSrBr₃:Eu 10% was grown to be about two centimeters in length and was relatively clear, colorless and crack-free. Its circular cross-section was just less than 2 centimeters in diameter. CsCaCl₃:Eu 10% was grown to be over three centimeters in length. It too was relatively clear, colorless and crack-free. Its circular cross-section measured about 11/16 inch in diameter.

Table 7 provides a summary table for these crystals as follows compared with benchmark NaI:Tl:

TABLE 7

|  | CsCaCl₃:Eu 10% | CsSrCl₃:Eu 10% | CsSrBr₃:Eu 10% | NaI:Tl |
| --- | --- | --- | --- | --- |
| Crystal structure | Cubic | Orthorhombic | Orthorhombic | Cubic |
| Melting point, ° C. | 910 | 842 | 760 | 651 |
| Density, g/cm³ | 2.9 | 3.06 | 3.76 | 3.67 |
| Light yield, ph/Mev | 18,000 | 46,000 | 31,000 | 38,000 |
| Energy resolution @ 662 kEv, % | 8.9 | >10 | 6.7 | 7.1 |
| Primary decay time, μsec | 4.1 | 1.6 | 3.5 | .23 |
| Hygroscopic | Low | Slightly | Low | Very |

The table demonstrates that promising results have been obtained for new, inorganic, single crystals as indicated above when compared with NaI:Tl including good transparency, low to no hygroscopicity, good light output and excellent proportionality. It is expected that with greater effort at purification of raw material and optimizing growth parameters that even better results will be achieved.

Figure 17:
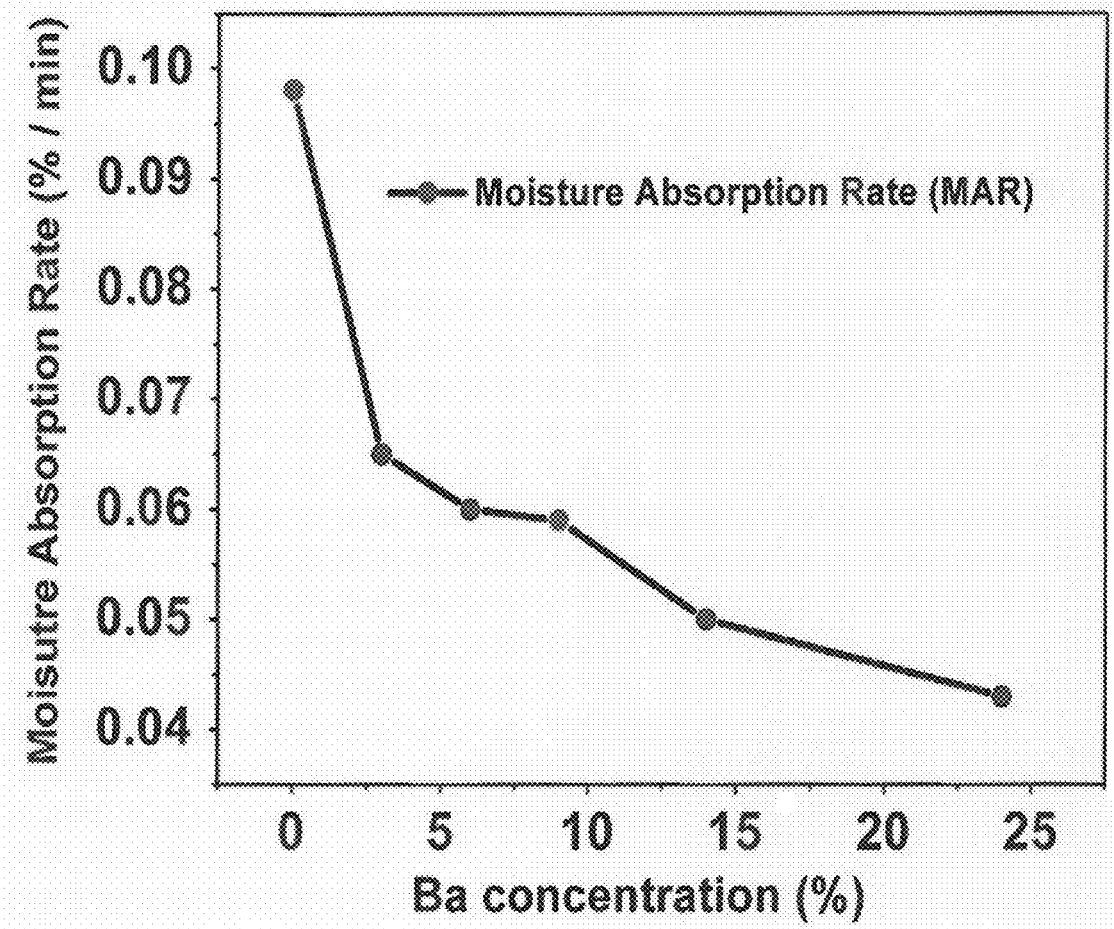
FIG. 17 is a graph of barium concentration in a CsBa$_x$Sr$_{1-x}$I$_3$:yEu system showing a decrease in moisture absorption rate (MAR) with increasing barium concentration from x=0.03 to x=0.24 and y=1%.
Figure 18:
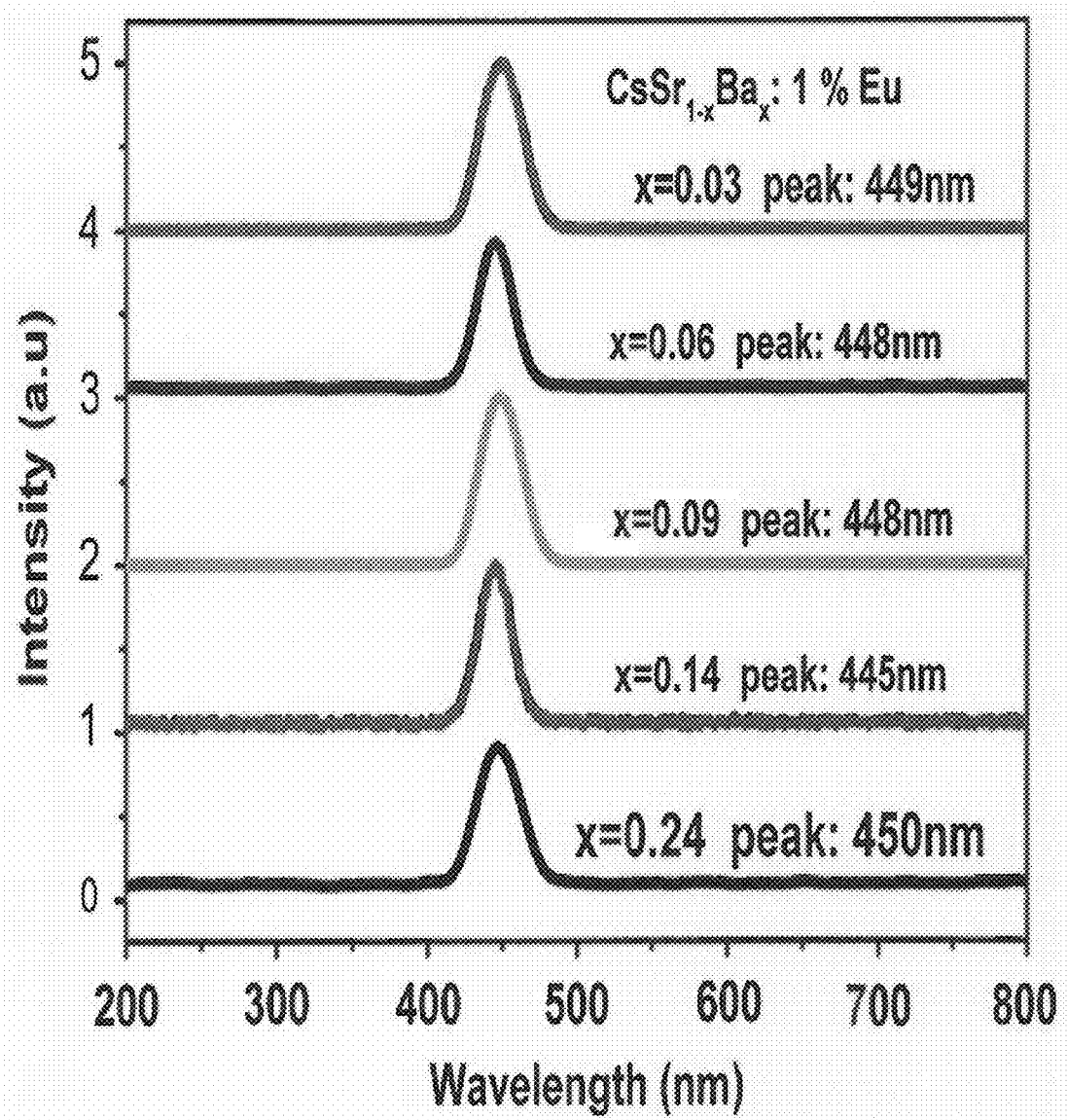
FIG. 18 is a collection of graphs showing radioluminescence spectra of CsSr$_{1-x}$Ba$_x$I$_3$:1% Eu at room temperature, the emission peaks appearing at between 445 nm and 450 nm.

A combination crystal is now described comprising $CsSr_{1-x}Ba_xI_3$:Eu 1% and 3%. Crystals were grown where x is between 0.00 and 0.24 inclusive. The purpose of graduated substitution of barium for strontium in, for example, an Eu mol 1% doped crystal was to see if the substitution has an impact on the hygroscopocity of $CsSrI_3$. The latter appears to be an absorber of moisture which adversely impacts its ability as a scintillator. As reported in Phys. Status Solidi RRL 5, No. 1, pp. 43-45 (2011), "Crystal growth and characterization of $CsSr_{1-x}Eu_xI_3$ high light yield scintillators," of the present inventors, incorporated herein by reference as to its entire contents, single crystals were grown and x-ray and gamma ray scintillation was noted; when x=0.08, then, the light yield was 65000 ph/MeV. Moreover, we have found that some Eu III (versus $Eu^{2+}$) may appear at the surface and be oxidized while $CsBaI_3$ was studied at Eu mol 1, 3 and 7% doping levels in U.S. Ser. No. 61/491,074 ("the '074 provisional") filed May 27, 2011 of the same inventors and incorporated by reference herein as to its entire contents; see Optical Materials 36 (2014) pp. 670-674, "The Europium oxidation state in $CsSrI_3$:Eu scintillators measured by X-ray absorption spectroscopy" of Zhuravleva et al., incorporated by reference as to its entire contents. Pictures of three sample single crystals are shown in FIG. 12 of the '074 provisional at Eu mol 1, 3 and 7% doping levels (each having a volume of approximately 50 $mm^3$); FIG. 13 shows the three samples excited with UV light and FIG. 14 provides data for gamma ray detection at Eu mol 7% doping level. Moreover, with partial substitution of barium for strontium, it was expected and proven that the orthorhombic crystal structure and congruent melting characteristics of $CsSrI_3$ are preserved. All of these combination crystals with x values at 0.03, 0.06, 0.09, 0.14 and 0.24 operated as a scintillator and were successfully fabricated as crack-free single crystals. However, with increasing barium concentration, there was exhibited a marked decrease in moisture absorption rate as seen in FIG. 17 taken from FIG. 6 of our article "Effect of Ba substitution in $CsSrI_3$:$Eu^{2+}$" published in the *Journal of Crystal Growth* 384 (2013) at 27-32 by the present inventors (the JCG 2013 article) incorporated herein by reference in its entirety and published on line 18 Sep. 2013. BaSr combination crystals depicted in this article are at 1.0% Eu doping, and the synthesis procedure yielded crack-free crystals that were colorless but slightly cloudy which may be due to impurities in the raw materials or the formation of small inclusions of a secondary phase. No cleavage planes are observed. Single crystal pieces were selected for characterization. With higher Ba concentration, the transparency decreased possibly due to formation of a secondary phase or point defect formation. FIG. 18 is a collection of graphs showing radioluminescence spectra of $CsSr_{1-x}Ba_xI_3$:1% Eu at room temperature, the emission peaks appearing at between 445 nm and 450 nm. The range of 445-450 nm is characteristic of the well-known 5d-4f transition. No impurities of defect emissions are observed. The small variations in peak position do not seem to be correlated with Ba concentration and are more likely due to small variations in crystal quality and optical absorption.

FIG. 8 of the JCG 2013 article shows emission and excitation spectra for 1% Eu for x values between 0.03 and 0.24. The moisture absorption rate (MAR) shown in FIG. 17 beginning at 0.098%/min with no barium concentration improves approximately 35% to 0.065%/min with just 3% barium concentration and is improved by approximately 50% to 0.05%/min at 14% barium concentration. This improvement in hygroscopicity is clearly significant. Table 8 below provides a table of increasing effective density and effective atomic number and decreasing hygroscopocity with increased barium concentration:

TABLE 8

| Property | $CsSr_{1-x}Ba_xI_3$:Eu | | | | |
|---|---|---|---|---|---|
| Ba Concentration Level x | 0.03 | 0.06 | 0.09 | 0.14 | 0.24 |
| Moisture Absorption Rate | 0.065 | 0.060 | 0.059 | 0.050 | 0.043 |
| Density (g/cm$^3$) calc. | 4.26 | 4.27 | 4.28 | 4.30 | 4.34 |
| Effective Atomic No. | 51.9 | 51.9 | 52.0 | 52.1 | 52.4 |

The increased density and effective atomic number results in an enhanced X-ray and gamma ray detection efficiency. Results of the improved scintillation properties are shown below in Table 9:

TABLE 9

| | $CsSr_{1-x}Ba_xI_3$:Eu | | | | |
|---|---|---|---|---|---|
| | x = 0.03 | x = 0.06 | x = 0.09 | x = 0.14 | x = 0.24 |
| Melt/Crystal Pt. | 632.4/596.4 | 625.0/594.6 | 609.2/607.5 | 610.9/585.4 | 588.7/579.9 |
| Light Yield (ph/MeV | 28,000 | 26,130 | 23,910 | 22,100 | 18,400 |
| Decay Time (µs) | 1.8 | 1.8 | 2.0 | 2.0 | 2.1 |
| Emission Peak | 449 | 448 | 448 | 445 | 450 |

X-ray radioluminescence exhibited a peak at 445-450 nm wavelength. The emission bands are characteristic of $Eu^{2+}$ 5d-4f luminescence. The emission is at a wavelength that is suitable for use with conventional photo detectors such as photo multiplier tubes (PMT's). Ultraviolet/visual excitation and emission were measured with an emission peak at 446 nm. The maximum light output was measured when x was at 3% and Eu mol 1% and measured at 28,000 photons per MeV with 1.9 µsecond decay time, the light output decreased with increasing x such that when x was 24%, the light output was 21,000 photons per MeV when Eu mol was 3% and the scintillation decay time 1.5 µseconds.

While various aspects of the present invention have been described above, it should be understood that they have been presented by way of example and not limitation. It will be apparent to persons skilled in the relevant art(s) that various changes in form and detail can be made therein without departing from the spirit and scope of the present invention. Thus, the present invention should not be limited by any of the above described exemplary aspects, but should be defined only in accordance with the following claims and their equivalents.

In addition, it should be understood that the figures in the attachments, which highlight the structure, methodology, functionality and advantages of the present invention, are presented for example purposes only. The present invention is sufficiently flexible and configurable, such that it may be implemented in ways other than that shown in the accompanying figures.

Further, the purpose of the foregoing Abstract is to enable the U.S. Patent and Trademark Office and the public generally and especially the scientists, engineers and practitioners in the relevant art(s) who are not familiar with patent or legal terms or phraseology, to determine quickly from a cursory inspection the nature and essence of this technical disclosure. The Abstract is not intended to be limiting as to the scope of the present invention in any way.

What we claim is:

1. A scintillator comprising the chemical composition $CsBa_xSr_{1-x}I_3$:yEu wherein y is approximately 0.01 and barium concentration x is between 0.00 and 0.24 inclusive, grown by one of a Bridgman method, a modified Bridgman method, a Czochralski method, a combined Czochralski/Bridgman method and a vertical gradient freeze method, a single crystal being formed and exhibiting decreased hygroscopocity with increasing concentration of barium.

2. The scintillator as recited in claim 1 where a moisture absorption rate of $CsBa_xSr_{1-x}I_3$:0.01Eu improves with increasing barium concentration from a level of 0.098% per minute at x=0.00 to 0.065% per minute at x=0.03 or 0.05% per minute at x=0.14.

* * * * *